United States Patent
Chen et al.

(10) Patent No.: US 10,736,422 B2
(45) Date of Patent: Aug. 11, 2020

(54) SLIDE RAIL ASSEMBLY

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Chun-Yi Ho, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 16/260,345

(22) Filed: Jan. 29, 2019

(65) Prior Publication Data

US 2020/0107636 A1   Apr. 9, 2020

(30) Foreign Application Priority Data

Oct. 4, 2018   (TW) .............................. 107135327 A
Nov. 29, 2018  (TW) .............................. 107143183 A

(51) Int. Cl.
*A47B 88/47* (2017.01)
*A47B 88/49* (2017.01)
*A47B 88/44* (2017.01)
*A47B 88/48* (2017.01)
*H05K 7/18* (2006.01)
(Continued)

(52) U.S. Cl.
CPC .......... *A47B 88/473* (2017.01); *A47B 88/447* (2017.01); *A47B 88/483* (2017.01); *A47B 88/49* (2017.01); *H05K 7/183* (2013.01)

(58) Field of Classification Search
CPC ....... A47B 88/40; A47B 88/44; A47B 88/443; A47B 88/447; A47B 88/473; A47B 88/477; A47B 88/483; A47B 88/49; A47B 88/08; A47B 88/12; A47B 2210/0016; A47B 2210/0018; A47B 2210/0064; A47B 2210/0067; A47B 2210/007; A47B 2210/0081
See application file for complete search history.

(56) References Cited

U.S. PATENT DOCUMENTS 6,585,335 B2 *  7/2003  Hwang ................. A47B 88/493
                                                            312/333
6,585,337 B1 *  7/2003  Chen ...................... A47B 88/57
                                                            312/333
(Continued)

FOREIGN PATENT DOCUMENTS

JP           3196678 U        3/2015

*Primary Examiner* — Andrew M Roersma
(74) *Attorney, Agent, or Firm* — Alan D. Kamrath; Karin L. Williams; Mayer & Williams PC

(57) ABSTRACT

A slide rail assembly includes a first rail, a second rail, a first structure, a second structure and a disengaging member. The disengaging member is arranged at a position on the second rail to be conveniently operated by a user. When the second rail is moved relative to the first rail to an extended position, the first structure and the second structure are configured to be engaged with each other, in order to hold the second rail at the extended position. Wherein, the disengaging member is configured to disengage the first structure from the second structure.

14 Claims, 18 Drawing Sheets

(51) Int. Cl.
    *A47B 88/473* (2017.01)
    *A47B 88/447* (2017.01)
    *A47B 88/483* (2017.01)

(56) References Cited

U.S. PATENT DOCUMENTS

| | | | |
|---|---|---|---|
| 6,935,710 B2 | 8/2005 | Chen et al. | |
| 7,357,468 B2 * | 4/2008 | Hwang | A47B 88/49 |
| | | | 312/333 |
| 7,753,460 B2 * | 7/2010 | Peng | A47B 88/493 |
| | | | 312/334.46 |
| 7,794,030 B2 * | 9/2010 | Peng | A47B 88/57 |
| | | | 312/334.46 |
| 8,147,011 B2 * | 4/2012 | Chen | H05K 7/1489 |
| | | | 312/333 |
| 8,672,431 B2 * | 3/2014 | Chen | F24C 15/168 |
| | | | 312/333 |
| 9,313,914 B2 * | 4/2016 | Judge | H05K 7/1489 |
| 9,480,183 B2 * | 10/2016 | Chen | H05K 7/1489 |
| 9,723,746 B2 * | 8/2017 | Chen | H05K 7/1489 |
| 9,854,909 B1 | 1/2018 | Chu | |
| 9,980,565 B2 | 5/2018 | Chen et al. | |
| 9,992,906 B2 | 6/2018 | Chen et al. | |
| 10,041,535 B2 | 8/2018 | Chen et al. | |
| 2008/0111457 A1 * | 5/2008 | Ji | A47B 88/493 |
| | | | 312/334.44 |
| 2016/0296017 A1 * | 10/2016 | Chen | A47B 88/49 |
| 2017/0099946 A1 * | 4/2017 | Chen | F16C 29/123 |
| 2017/0208942 A1 * | 7/2017 | Chen | F16C 29/123 |
| 2018/0295989 A1 | 10/2018 | Chen et al. | |

* cited by examiner

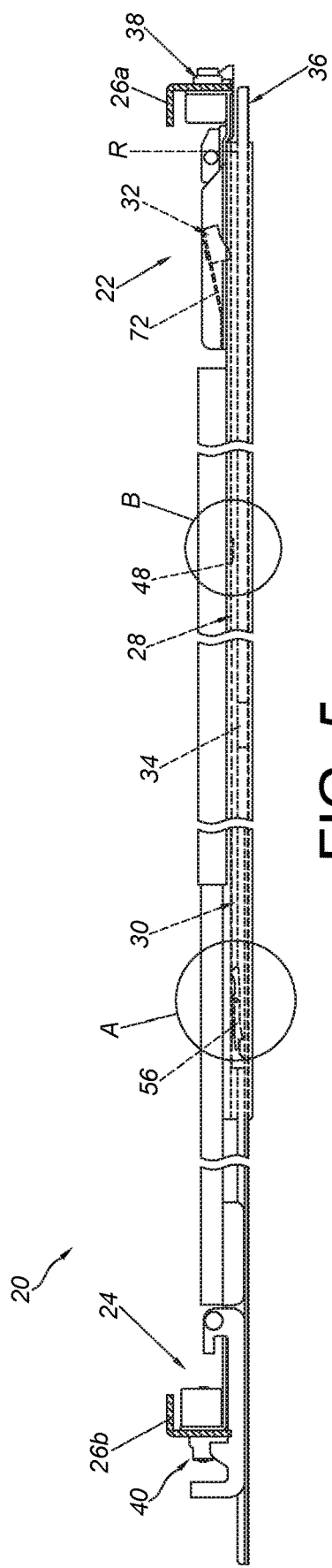
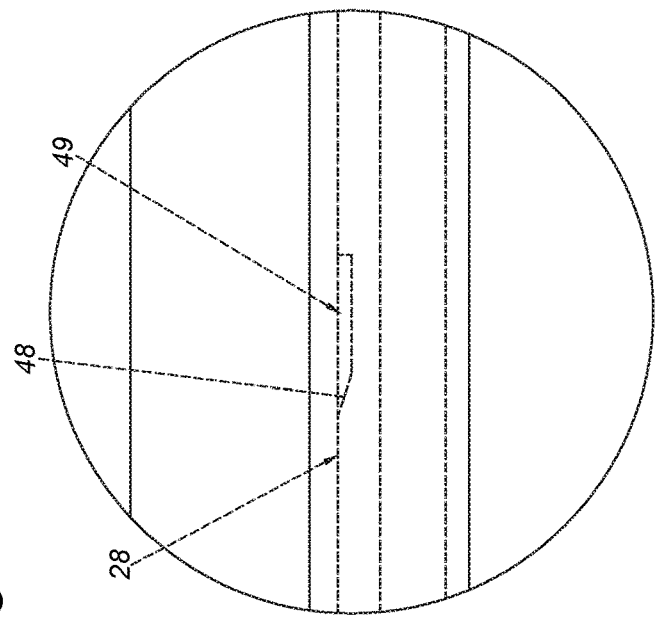
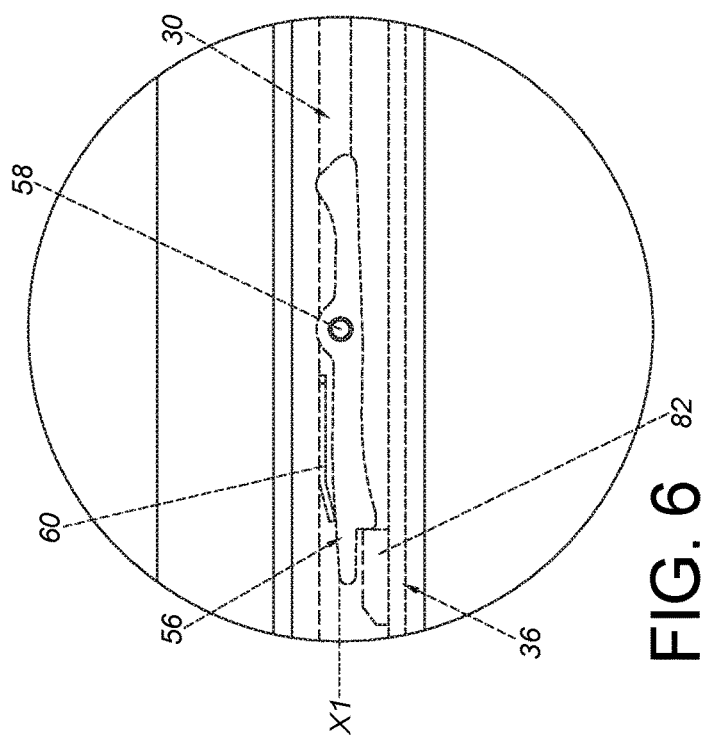
FIG. 5
FIG. 6
FIG. 7

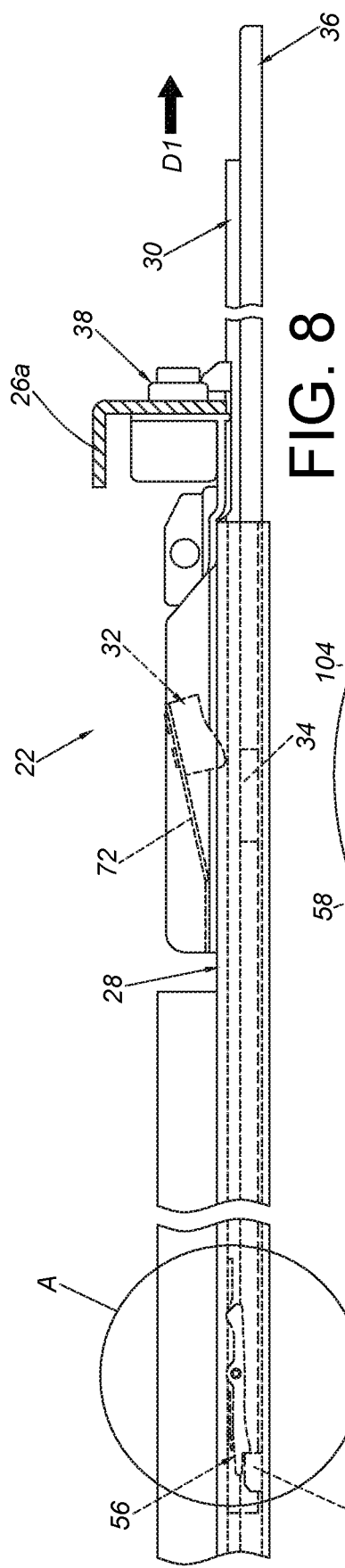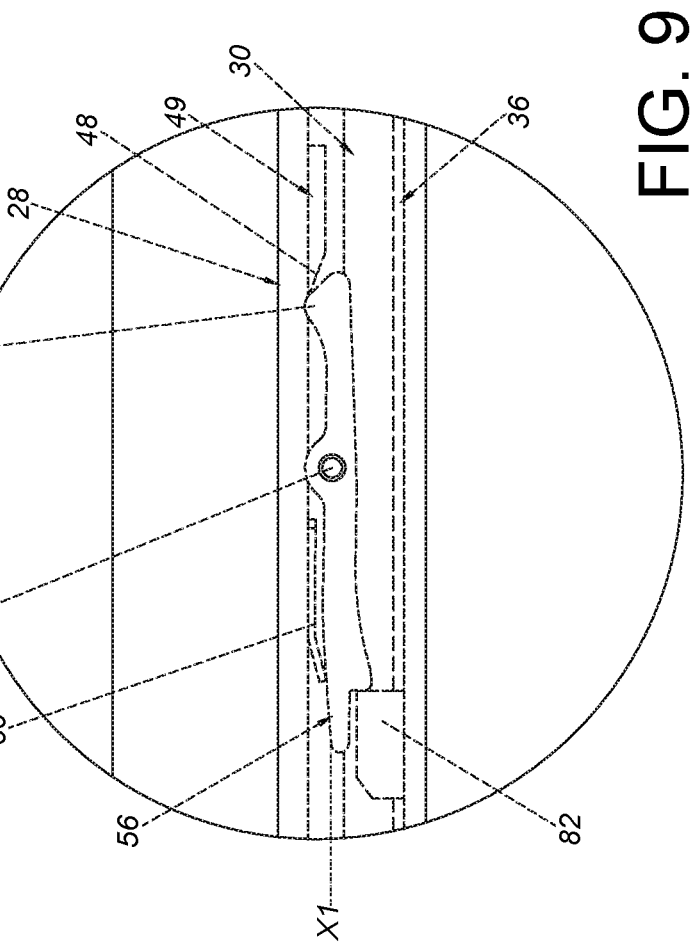
FIG. 8
FIG. 9

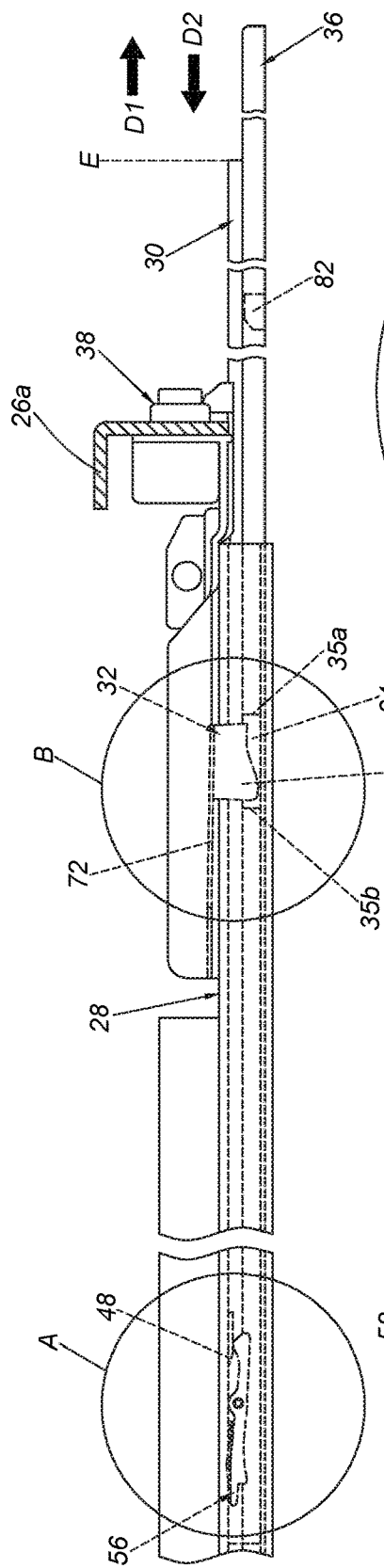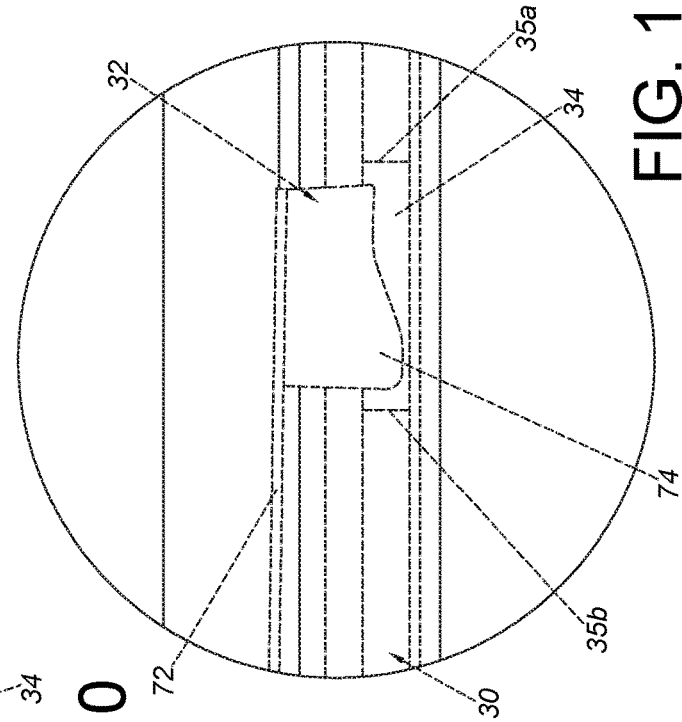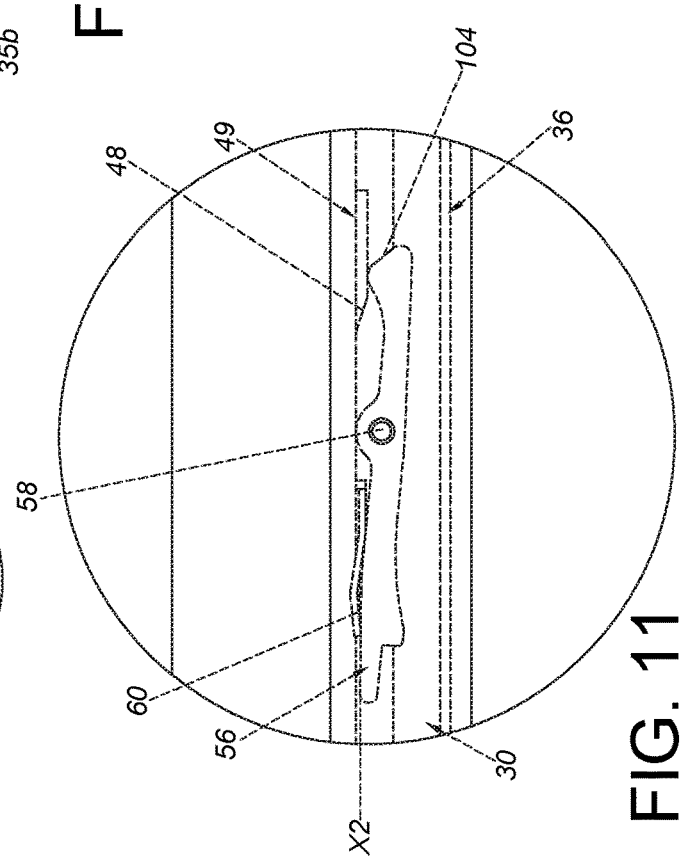

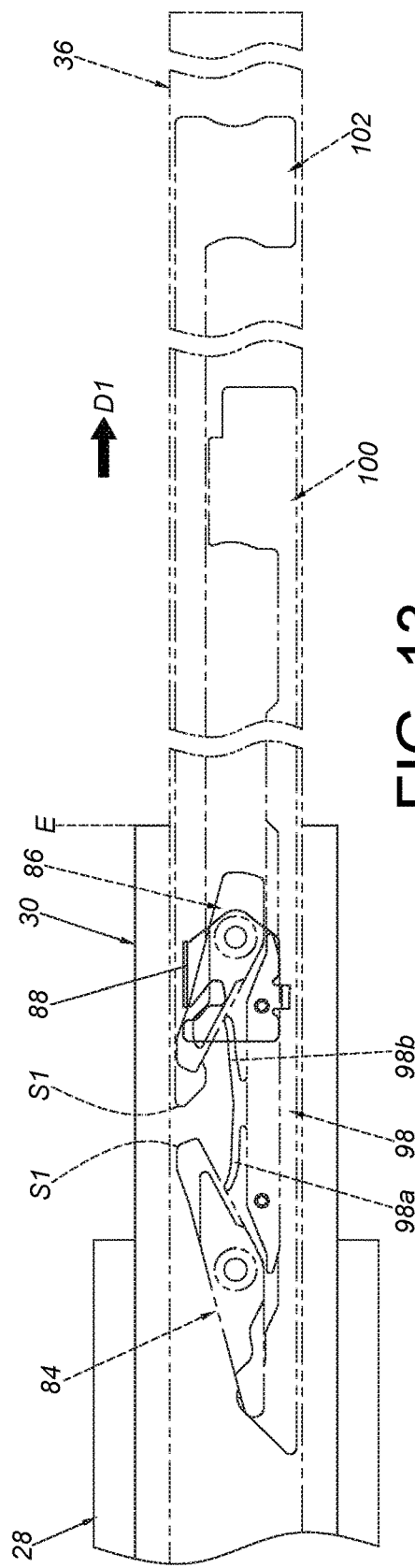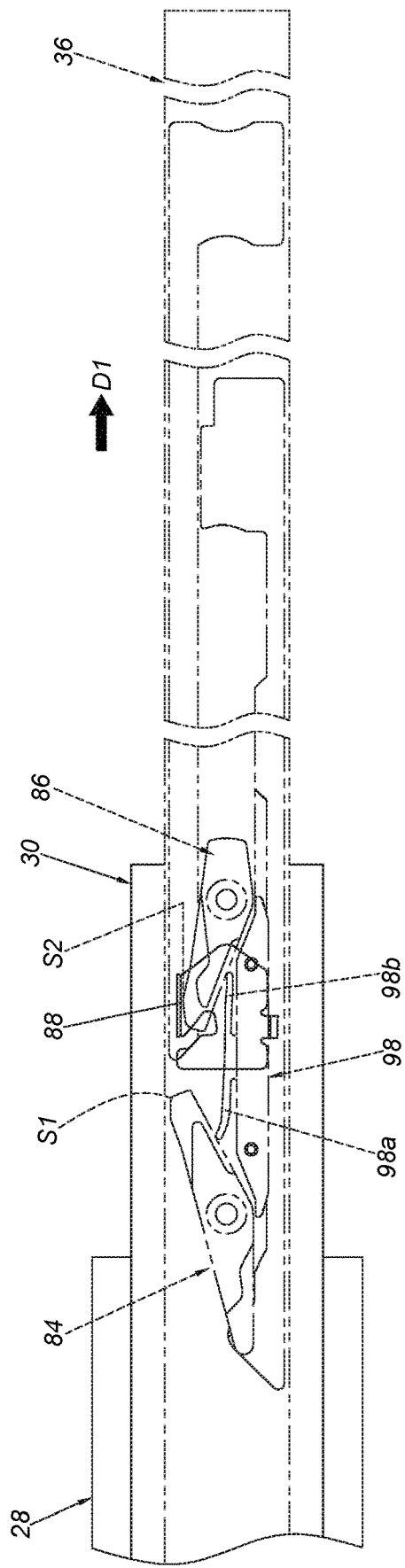

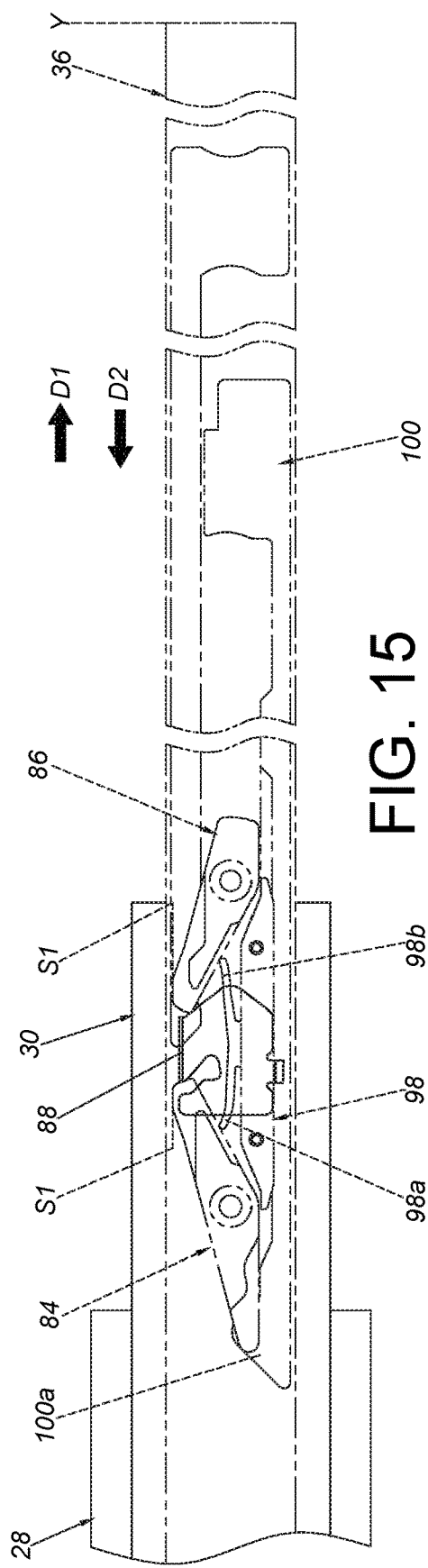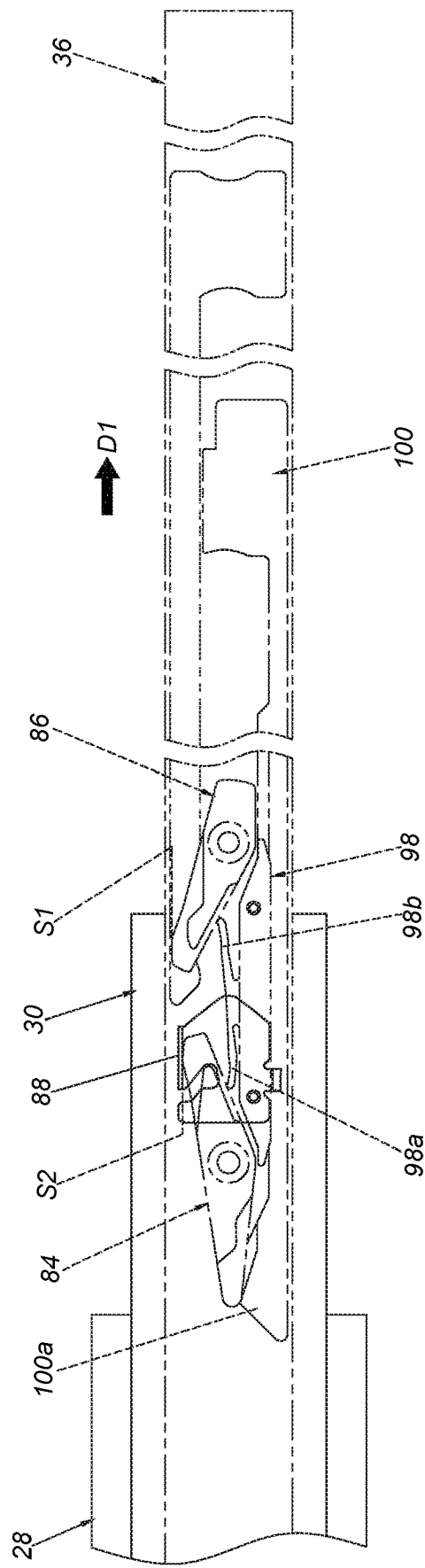

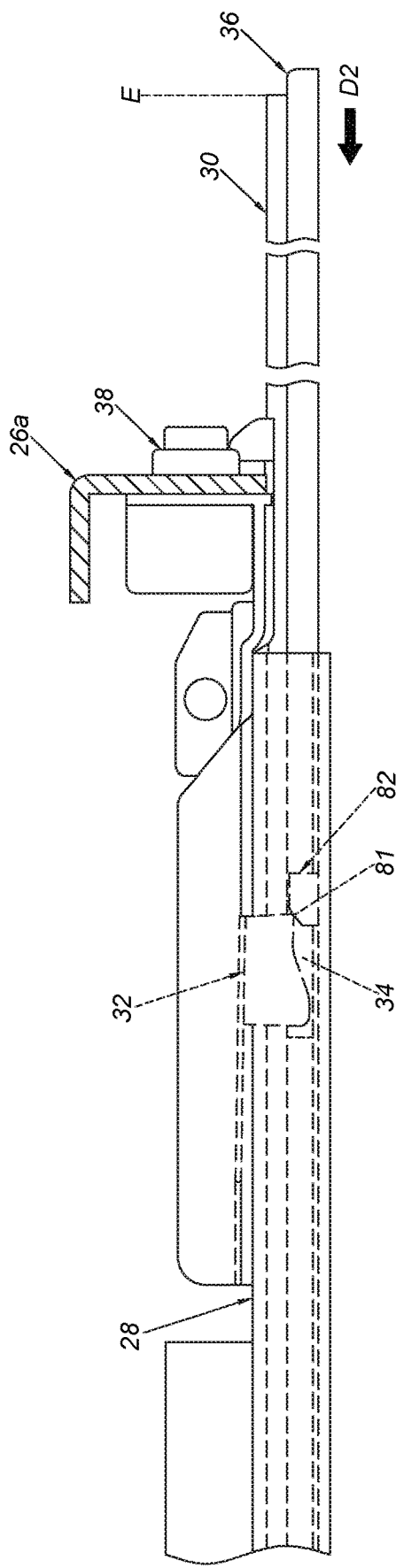
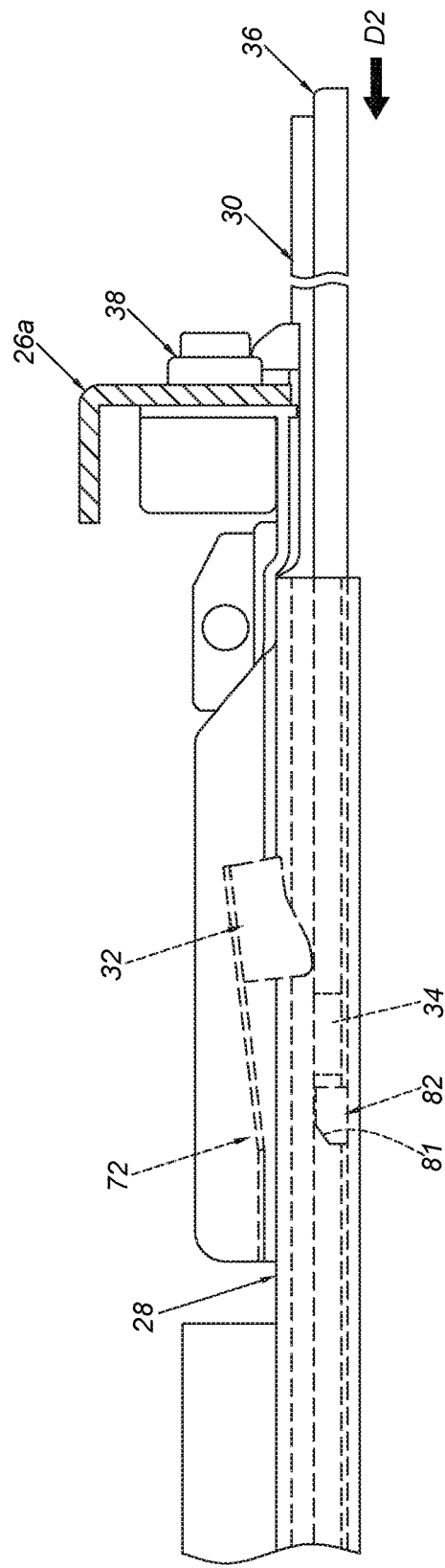

SLIDE RAIL ASSEMBLY

BACKGROUND OF THE INVENTION

1. Field of the Invention

The present invention relates to a slide rail mechanism, and more particularly, to a slide rail assembly comprising at least two rails.

2. Description of the Prior Art

As shown in FIG. 1, in a rack system, a rack usually complies with a predetermined specification. For example, the rack can be a standard rack specified by the Electronic Industries Association (EIA).

Moreover, each of a first post 1a and a second post 1b of the rack (or a cabinet) has a predetermined height, and a plurality of slide rail assemblies are usually arranged between the first post 1a and the second post 1b from top to bottom. For example, a first slide rail assembly 3a, a second slide rail assembly 3b, a third slide rail assembly 3c and a fourth slide rail assembly 3d are arranged between the first post 1a and the second post 1b. Each of the slide rail assemblies comprises a first rail 5, a second rail 7 and a third rail 9. Wherein, the first rail 5 is mounted to the first post 1a and the second post 1b through a first bracket 11 and a second bracket 13 respectively. On the other hand, when the second rail 7 of the third slide rail assembly 3c is located at an extended position P, corresponding structures of the second rail 7 and the first rail 5 (such as a first structure 15a and a second structure 15b being engaged with each other) are configured to temporarily hold the second rail 7 at the extended position P, in order to facilitate related maintenance operations on a rail of the slide rail assembly or a carried object 17 carried by the rail. However, since a position where the first structure 15a and the second structure 15b of the third slide rail assembly 3c are engaged with each other is away from a front part 5a of the first rail 5 (or away from the first post 1a), and a specification height h (such as 44.45 mm) is defined between two adjacent slide rail assemblies due to the predetermined specification, sometimes it is not easy for a user to reach into a space defined by the specification height h between the two adjacent slide rail assemblies. Particularly, the user must extend the hand into the space a distance K to operate in order to detach the first structure 15a from the second structure 15b, which is not convenient. If the second rail 7 is located at the extended position P to be outside the rack, a person walking nearby the rack might be hurt.

Therefore, it is important to develop various slide rail products for different market requirements.

SUMMARY OF THE INVENTION

The present invention relates to a mechanism capable of preventing a rail from being moved relative to another rail from an extended position, and allowing a user to conveniently disable the mechanism at the extended position.

According to an embodiment of the present invention, a slide rail assembly comprises a first rail, a second rail, a first structure and a second structure. The second rail is movable relative to the first rail. The first structure is arranged adjacent to an end part of the first rail. The second structure is arranged on the second rail. Wherein, when the second rail is moved relative to the first rail from a retracted position to an extended position along a first direction, the first structure and the second structure are configured to be engaged with each other, in order to prevent the second rail from being moved from the extended position along the first direction or a second direction. Wherein, the second direction is opposite to the first direction.

Preferably, the slide rail assembly further comprises a disengaging member arranged on the second rail. Wherein, the disengaging member is configured to disengage the first structure from the second structure. Wherein, when the second rail is located at the extended position, a portion of the disengaging member exceeds beyond the end part of the first rail.

Preferably, the disengaging member is movably mounted to the second rail. The disengaging member and the second rail are movable relative to each other within a limited range through interaction between a first guiding feature and a second guiding feature.

Preferably, the first guiding feature and the second guiding feature are respectively a protrusion and an elongated hole. The protrusion penetrates through a portion of the elongated hole.

Preferably, the slide rail assembly further comprises a return spring configured to provide an elastic force to the disengaging member, in order to hold the disengaging member at a predetermined position.

Preferably, one of the disengaging member and the first structure has a guiding part. The disengaging member is configured to disengage the first structure from the second structure through the guiding part.

Preferably, the slide rail assembly further comprises a third rail movable relative to the second rail. Wherein, one of the third rail and the first structure is arranged with a disengaging part. When the third rail is moved a predetermined retracted distance from a completely extended position along the second direction, the third rail is configured to disengage the first structure from the second structure through the disengaging part.

Preferably, one of the first structure and the second structure has a hook, and the other one of the first structure and the second structure is a hole configured to allow the hook to penetrate through, such that two hole walls of the hole are located at two sides of the hook.

Preferably, the first rail is arranged with a bracket. The first structure is arranged on the bracket.

Preferably, the slide rail assembly further comprises a releasing member arranged on the bracket and configured to be operated to detach the first structure from the second structure.

Preferably, the releasing member has an operating part. The operating part is adjacent to at least one mounting member of the bracket.

Preferably, the slide rail assembly further comprises a third rail movable relative to the second rail. Wherein, the first rail is arranged with a disengaging feature. A synchronizing member is movably mounted to the second rail. The third rail comprises a synchronizing feature. The synchronizing feature is configured to abut against the synchronizing member in a predetermined state, in order to allow the second rail and the third rail to synchronously move relative to the first rail along the first direction. When the second rail and the third rail are moved to the extended position, the disengaging feature is configured to move the synchronous member to be no longer in the predetermined state, such that the second rail is no longer synchronously moved with the third rail.

Preferably, the synchronous member is pivoted to the second rail. The slide rail assembly further comprises an elastic feature configured to provide an elastic force to the synchronous member, in order to hold the synchronous member in the predetermined state.

According to another embodiment of the present invention, a slide rail assembly comprises a first rail, a second rail, a first bracket, a second bracket, a first structure and a second structure. The first rail has a front part and a rear part. The second rail is movable relative to the first rail. The first bracket is arranged adjacent to the front part of the first rail. The first bracket comprises at least one mounting member configured to mount the first rail to a first post of a rack. The second bracket is movably arranged adjacent to the rear part of the first rail. The second bracket comprises at least one mounting member configured to mount the first rail to a second post of the rack. The first structure is arranged on the first bracket. The second structure is arranged on the second rail. Wherein, when the second rail is located at an extended position relative to the first rail, the first structure and the second structure are configured to be engaged with each other.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5 is a diagram showing the slide rail assembly being mounted to two posts of the rack, and the slide rail assembly being in a retracted state according to the first embodiment of the present invention;

FIG. 6 is an enlarged view of an area A of FIG. 5;

FIG. 7 is an enlarged view of an area 3 of FIG. 5;

FIG. 8 is a diagram showing the slide rail assembly being mounted to the post of the rack, and a second rail and a third rail of the slide rail assembly being synchronously moved relative to a first rail along a first direction according to the first embodiment of the present invention;

FIG. 9 is an enlarged view of an area A of FIG. 8;

FIG. 10 is a diagram showing the second rail and the third rail of the slide rail assembly being further moved relative to the first rail along the first direction, and the second rail being located at an extended position according to the first embodiment of the present invention;

FIG. 11 is an enlarged view of an area A of FIG. 10;

FIG. 12 is an enlarged view of an area B of FIG. 10;

FIG. 13 is a diagram showing the third rail of the slide rail assembly being moved relative to the second rail along the first direction according to the first embodiment of the present invention;

FIG. 14 is a diagram showing the third rail of the slide rail assembly being further moved relative to the second rail along the first direction according to the first embodiment of the present invention;

FIG. 15 is a diagram showing the third rail of the slide rail assembly being further moved relative to the second rail along the first direction to a completely extended position according to the first embodiment of the present invention;

FIG. 16 is a diagram showing a working member being no longer blocked by the second rail, and the third rail of the slide rail assembly being moved relative to the second rail away from the completely extended position along the first direction according to the first embodiment of the present invention;

FIG. 23 is a diagram showing the third rail of the slide rail assembly being retracted from an extended position along a direction according to the second embodiment of the present invention;

FIG. 24 is a diagram showing the third rail of the slide rail assembly being further retracted along the direction to disengage the first rail from the second rail according to the second embodiment of the present invention;

DETAILED DESCRIPTION

Figure 2:
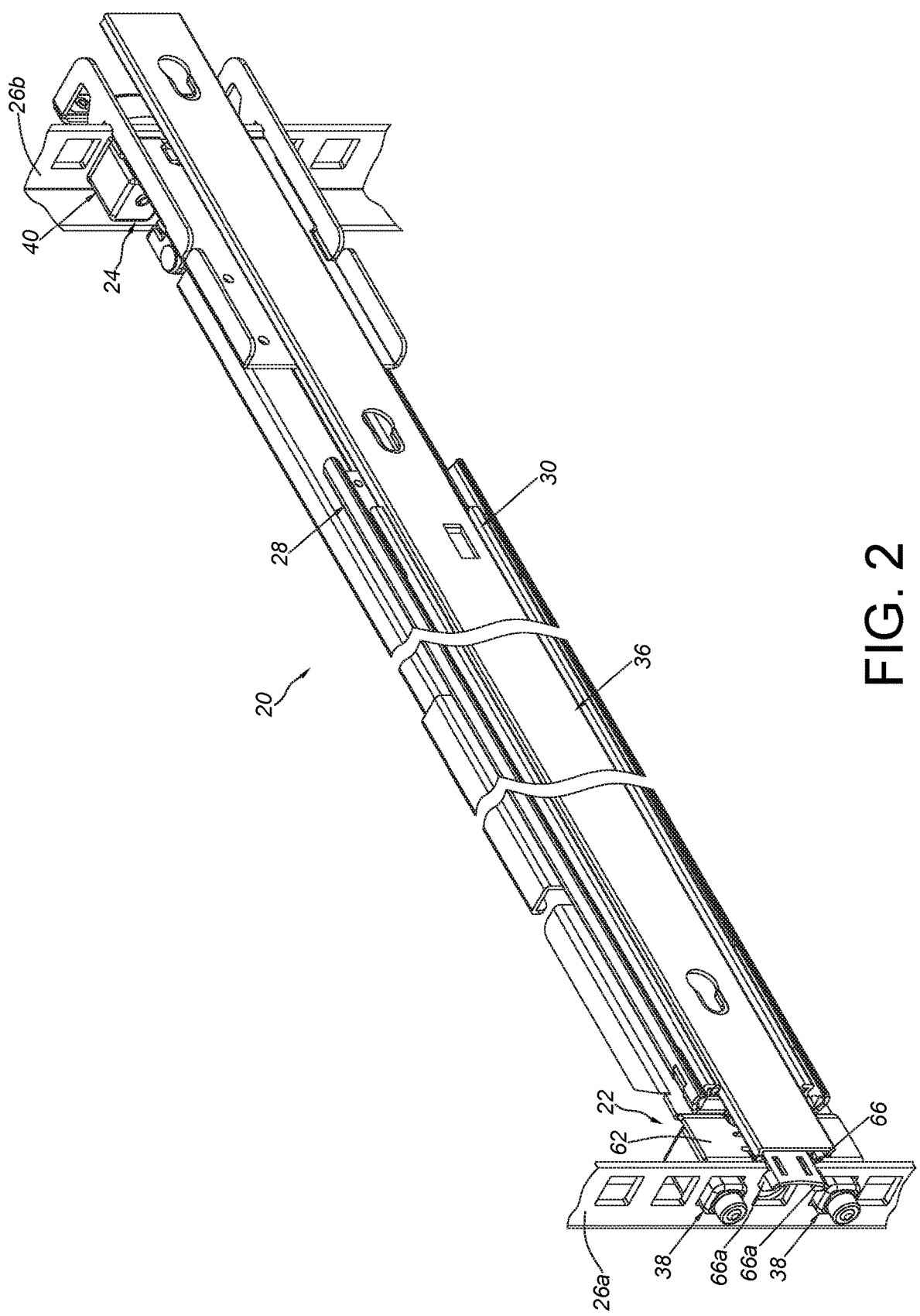
FIG. 2 is a diagram showing a slide rail assembly being mounted to a rack according to a first embodiment of the present invention.
Figure 3:
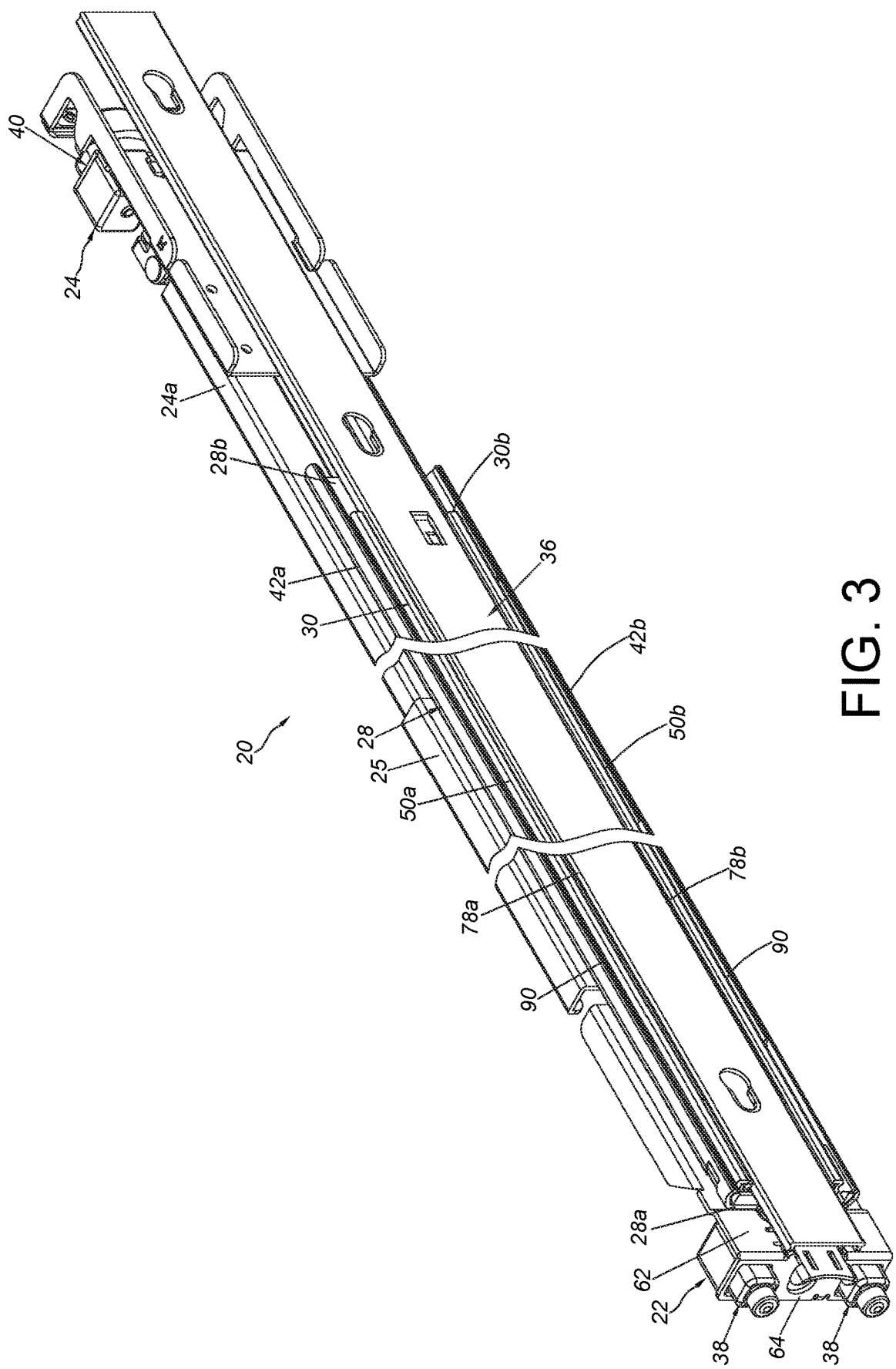
FIG. 3 is a diagram showing the slide rail assembly according to the first embodiment of the present invention.
Figure 4:
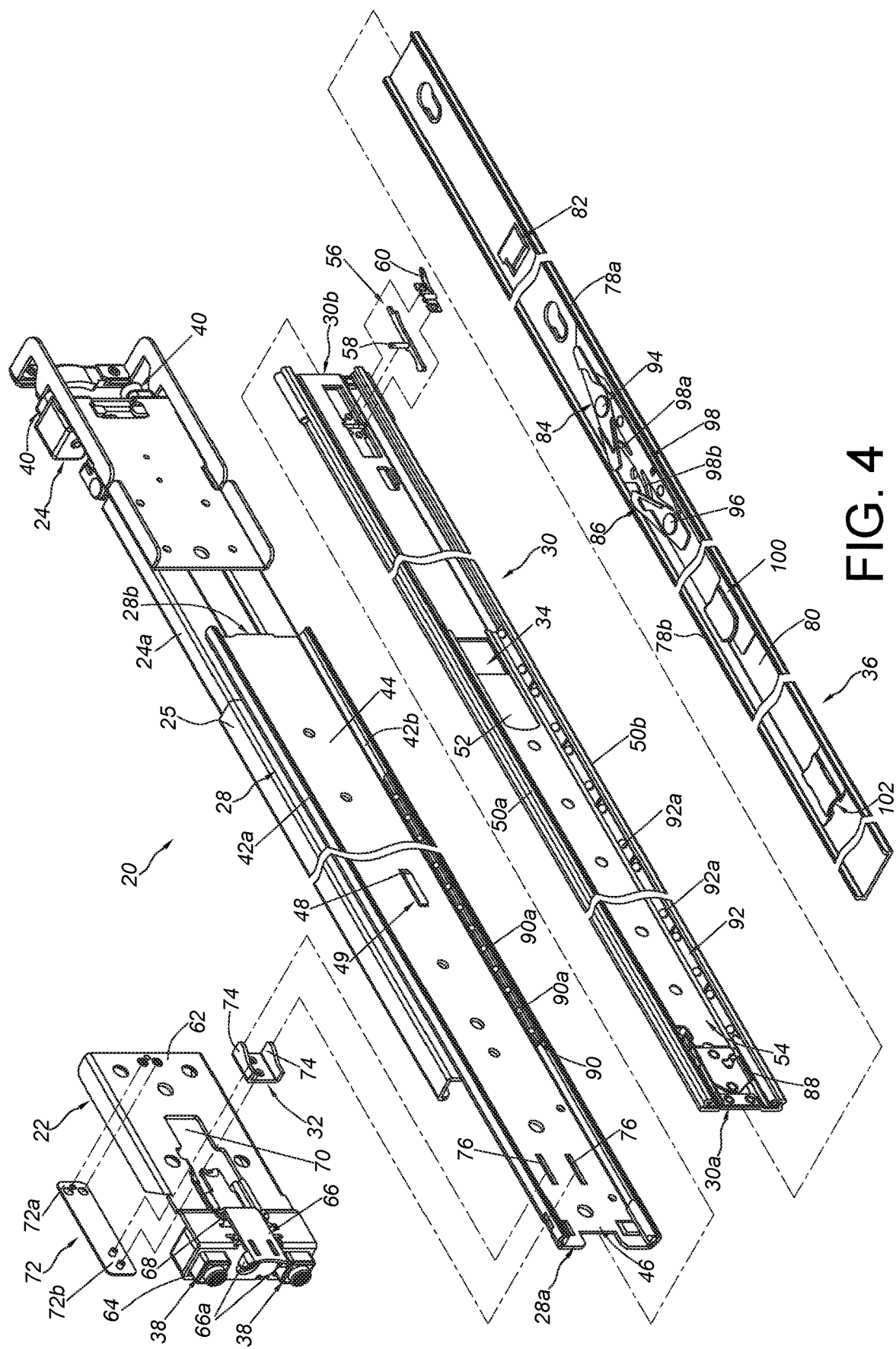
FIG. 4 is an exploded view of the slide rail assembly according to the first embodiment of the present invention.

As shown in FIG. 2, FIG. 3 and FIG. 4, a slide rail assembly 20 is configured to be mounted to a first post 26a and a second post 26b of a rack through a first bracket 22 and a second bracket 24 according to an embodiment of the present invention.

The slide rail assembly 20 comprises a first rail 28, a second rail 30, a first structure 32 and a second structure 34. Preferably, the slide rail assembly 20 further comprises a third rail 36.

The first rail 28 has a first end part 28a and a second end part 28b, such as a front part and a rear part. Preferably, the first bracket 22 is arranged adjacent to the first end part 28a of the first rail 28. On the other hand, the second bracket 24 is movably arranged adjacent to the second end part 28b of the first rail 28. For example, the second bracket 24 is retractably connected to a supporting base 25 at a back side of the first rail 28 through an extension frame 24a, such that the second bracket 24 is longitudinally adjustable relative to the first rail 28. Each of the first bracket 22 and the second bracket 24 comprises at least one mounting member. For example, the first bracket 22 comprises a plurality of first mounting members 38, and the second bracket 24 comprises a plurality of second mounting members 40. The first bracket 22 and the second bracket 24 are configured to mount the first rail 28 to the first post 26a and the second post 26b respectively through the first mounting members 38 and the second mounting members 40. Moreover, the first rail 28 comprises a first wall 42a, a second wall 42b and a longitudinal wall 44 connected between the first wall 42a and the second wall 42b. A first passage 46 is defined by the first wall 42a, the second wall 42b and the longitudinal wall 44 of the first rail 28. Preferably, the first rail 28 is arranged with a disengaging feature 48, and the disengaging feature 48 has an inclined surface or an arc surface. Preferably, the first rail 28 is arranged with a protrusion 49 on the longitudinal wall 44, and the protrusion 49 has the disengaging feature 48.

The second rail 30 is movable relative to the first rail 28. Preferably, the second rail 30 is mounted into the first passage 46 of the first rail 28. The second rail 30 has a first end part 30a and a second end part 30b, such as a front part and a rear part. Moreover, the second rail 30 comprises a first wall 50a, a second wall 50b and a longitudinal wall 52 connected between the first wall 50a and the second wall 50b. A second passage 54 is defined by the first wall 50a, the second wall 50b and the longitudinal wall 52 of the second rail 30. The first wall 50a, the second wall 50b and the longitudinal wall 52 of the second rail 30 respectively correspond to the first wall 42a, the second wall 42b and the longitudinal wall 44 of the first rail 28. Preferably, a synchronizing member 56 is movably mounted to the second rail 30. In the present embodiment, the synchronizing member 56 is pivoted to the longitudinal wall 52 of the second rail 30 through a shaft 58, and the slide rail assembly 20 further comprises an elastic feature 60, such as an elastic arm, configured to provide an elastic force to the synchronizing member 56.

The first structure 32 is arranged adjacent to the first end part 28a of the first rail 28. In the present embodiment, the first structure 32 is arranged on the first bracket 22. Specifically, the first bracket 22 comprises a side wall 62, an end wall 64, a fastening member 66 and an elastic member 68. The end wall 64 is substantially perpendicularly bent relative to the side wall 62. The end wall 64 is arranged with the first mounting members 38. The fastening member 66 is movably mounted (such as pivoted) to the side wall 62. The elastic member 68 (such as a spring or an elastic piece) is configured to provide an elastic to the fastening member 66, so as to hold the fastening member 66 in a locking state and allow a fastening part 66a of the fastening member 66 to be adjacent to the first mounting members 38 on the end wall 64, in order to lock the first post 26a (as shown in FIG. 2). Preferably, the side wall 62 of the first bracket 22 has an opening 70. One end 72a of an elastic component 72 (such as an elastic arm) is connected to the side wall 62, and the other end 72b of the elastic component 72 is arranged with the first structure 32. The first structure 32 is located at a position corresponding to the opening 70. Preferably, the first structure 32 has a hook 74. Moreover, the hook 74 is located at a position corresponding to a through hole 76 of the first rail 28 and extended toward the second rail 30.

The second structure 34 is arranged on the second rail 30. Preferably, the second structure 34 is a hole (or a recessed part) configured to interact with the hook 74 of the first structure 32. Preferably, the second structure 34 is arranged on the longitudinal wall 52 of the second rail 30.

The third rail 36 is movable relative to the second rail 30. Preferably, the third rail 36 is mounted into the second passage 54 of the second rail 30. Specifically, the third rail 36 comprises a first wall 78a, a second wall 78b and a longitudinal wall 80 connected between the first wall 78a and the second wall 78b. The first wall 78a, the second wall 78b and the longitudinal wall 80 of the third rail 36 respectively correspond to the first wall 50a, the second wall 50b and the longitudinal wall 52 of the second rail 30. Preferably, the third rail 36 comprises a synchronizing feature 82 (such as a protrusion) arranged on the longitudinal wall 80 of the third rail 36. The synchronizing feature 82 is configured to interact with the synchronizing member 56. Preferably, the slide rail assembly 20 further comprises a first working member 84 and a second working member 86 operatively connected to the longitudinal wall 80 of the third rail 36, and a blocking part 88 is arranged adjacent to the first end part 30a of the second rail 30. The blocking part 88 is arranged on the longitudinal wall 52 of the second rail 30 and laterally protruded relative to the longitudinal wall 52.

Preferably, the slide rail assembly 20 further comprises a first slide assisting device 90 and a second slide assisting device 92. The first slide assisting device 90 comprises a plurality of first rolling members 90a (such as balls or wheels) rollingly supported between the first rail 28 and the second rail 30, in order to assist in movement of the second rail 30 relative to the first rail 28. On the other hand, the second slide assisting device 92 comprises a plurality of second rolling members 92a (such as balls or wheels) rollingly supported between the second rail 30 and the third rail 36, in order to assist in movement of the third rail 36 relative to the second rail 30. Preferably, the first working member 84 and the second working member 86 are pivoted to the longitudinal wall 80 of the third rail 36 through a first shaft 94 and a second shaft 96 respectively. The slide rail assembly 20 further comprises an elastic base 98 arranged on the longitudinal wall 80 of the third rail 36. The elastic base 98 has a first elastic part 98a and a second elastic part 98b configured to provide elastic forces to the first working member 84 and the second working member 86 respectively. Preferably, the slide rail assembly 20 further comprises a first operating member 100 and a second operating member 102 configured to operated the first working member 84 and the second working member 86 respectively.

As shown in FIG. 5, FIG. 6 and FIG. 7, the first rail 28 of the slide rail assembly 20 is fixedly mounted to the first post 26a and the second post 26b respectively through the first bracket 22 and the second bracket 24, and the second rail 30 is located at a retracted position R relative to the first rail 28. On the other hand, the third rail 36 is retracted relative to the second rail 30.

Moreover, the synchronizing member 56 of the second rail 30 is in a predetermined state X1. Preferably, the synchronizing member 56 is configured to be held in the predetermined state X1 in response to the elastic force of the elastic feature 60. The synchronizing feature 82 of the third rail 36 is configured to interact with the synchronizing member 56 in the predetermined state X1. In the present embodiment, the synchronizing feature 82 of the third rail 36 is configured to abut against the synchronizing member 56 in the predetermined state X1. Wherein, the synchronizing member 56 of the second rail 30 is spaced from the disengaging feature 48 of the first rail 28. On the other hand, the second structure 34 is spaced from the first structure 32. Wherein, the first structure 32 abuts against the longitudinal wall 52 of the second rail 30, such that the elastic component 72 is in a state of accumulating an elastic force.

As shown in FIG. 8 and FIG. 9, when the third rail 36 is moved along a first direction D1, the synchronizing feature 82 is configured to abut against the synchronizing member 56 in the predetermined state X1, such that the second rail 30 and the third rail 36 can be synchronously moved relative to the first rail 28 along the first direction D1. When the second rail 30 and the third rail 36 are moved a predetermined distance, a part 104 of the synchronizing member 56 of the second rail 30 contacts the disengaging feature 48 of the first rail 28. Preferably, the part 104 of the synchronizing member 56 has an inclined surface or an arc surface. Meanwhile, the second structure 34 of the second rail 30 is close to the first structure 32.

As shown in FIG. 10, FIG. 11 and FIG. 12, when the third rail 36 and the second rail 30 are further moved along the first direction D1 until the second rail 30 is located at an extended position E, the synchronizing member 56 is no longer in the predetermined state X1 (such as being switched to another state X2 shown in FIG. 11) due to the disengaging feature 48. Therefore, the synchronizing feature 32 of the third rail 36 no longer abuts against the synchronizing member 56, such that the second rail 30 is no longer synchronously moved with the third rail 36. In the present embodiment, the part 104 and the disengaging feature 48 abut against each other to generate an acting force, such that the synchronizing member 56 is deflected from the predetermined state X1 to another state X2. In the meantime, the elastic feature 60 is in a state of accumulating an elastic force. On the other hand, when the second rail 30 is located at the extended position E, the first structure 32 and the second structure 34 interact with each other, in order to prevent the second rail 30 from being moved relative to the first rail 28 from the extended position E along the first direction D1 or a second direction D2 opposite to the first direction D1. In the present embodiment, the first structure 32 and the second structure 34 are engaged with each other. For example, the second structure 34 can be a hole configured to allow the hook 74 of the first structure 32 to penetrate through in response to the elastic component 72 releasing the elastic force, such that two walls of the hole, such as a first wall 35a and a second wall 35b, are located at two sides of the hook 74. According to such arrangement, the second rail 30 can be prevented from being moved from the extended position E along the first direction D1 or the second direction D2.

As shown in FIG. 13, FIG. 14 and FIG. 15, the second rail 30 is located at the extended position E relative to the first rail 28. On the other hand, the first elastic part 98a and the second elastic part 98b of the elastic base 98 of the third rail 36 are configured to provide elastic forces to the first working member 84 and the second working member 86 respectively, in order to hold the first working member 84 and the second working member 86 in a first state S1.

Moreover, when the third rail 36 is moved a predetermined distance relative to the second rail 30 along the first direction D1, the second working member 86 contacts a first side of the blocking part 88 of the second rail 30 (as shown in FIG. 13). When the third rail 36 is further moved relative to the second rail 30 along the first direction D1, the second working member 86 interacts with the blocking part 88, such that the second working member 86 is deflected from the first state S1 to a second state S2 (as shown in FIG. 14) to cross the first side of the blocking part 88. In the meantime, the second elastic part 98b is in a state of accumulating an elastic force. When the third rail 36 is further moved relative to the second rail 30 along the first direction D1 to a completely extended position Y (as shown in FIG. 15), the second working member 86 returns to the first state S1 in response to the elastic force of the second elastic part 98b. In the meantime, the second working member 86 is located at a second side of the blocking part 88 (as shown in FIG. 15). On the other hand, the first working member 84 is in the first state S1 and located at the first side of the blocking part 88. Briefly, when the third rail 36 is located at the completely extended position Y relative to the second rail 30 (as shown in FIG. 15), the first working member 84 and the second working member 86 are in the first state S1 and respectively located at the first side and the second side of the blocking part 88 to block the blocking part 88, in order to prevent the third rail 36 from being moved from the completely extended position Y along the first direction D1 or the second direction D2.

Figure 17:
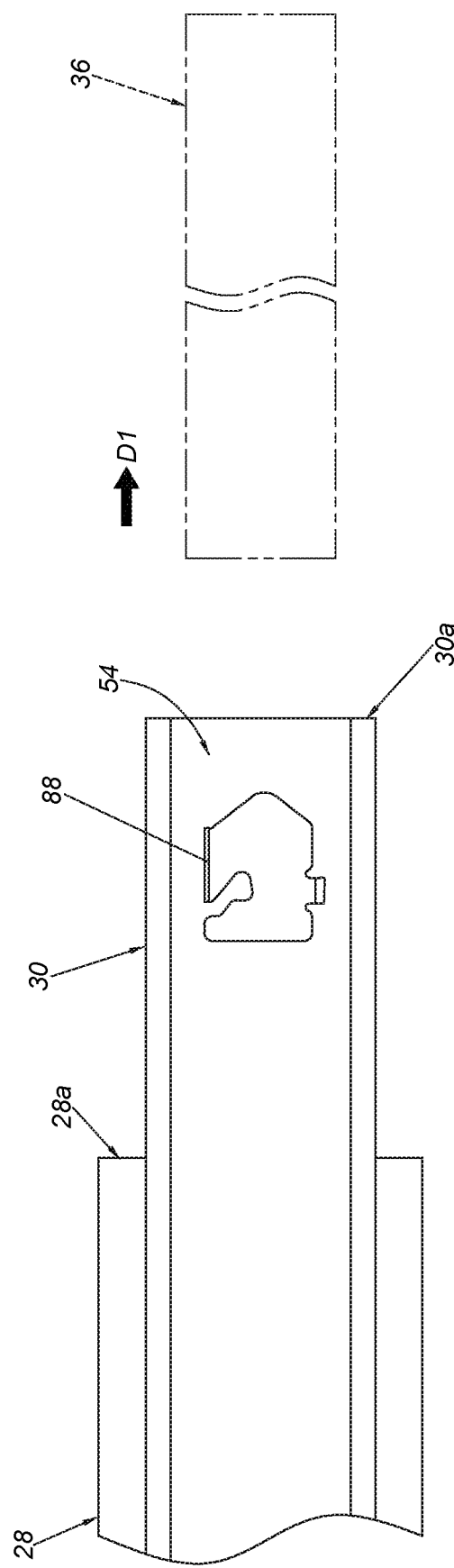
FIG. 17 is a diagram showing the second rail of the slide rail assembly being located at the extended position relative to the first rail, and the third rail being detached from the second rail according to the first embodiment of the present invention.

As shown in FIG. 15, FIG. 16 and FIG. 17, when the third rail 36 is located at the completely extended position Y relative to the second rail 30 and when a user is going to move the third rail 36 from the completely extended position Y along the first direction D1 or the second direction D2, the user can operate the first working member 84 or the second working member 86 to be no longer in the first state S1. For example, the user can apply a force along the first direction D1 to the first operating member 100, such that a driving part 100a of the first operating member 100 can drive the first working member 84 to deflect from the first state S1 to another state (such as the second state S2 shown in FIG. 16), in order to move the third rail 36 from the completely extended position Y along the first direction D1 to be outside the second passage 54 of the second rail 30. In other words, the third rail 36 can be detached from the second rail 30. Moreover, the first working member 84, the second working member 86 and the elastic base 98 are omitted from FIG. 17.

Figure 18:
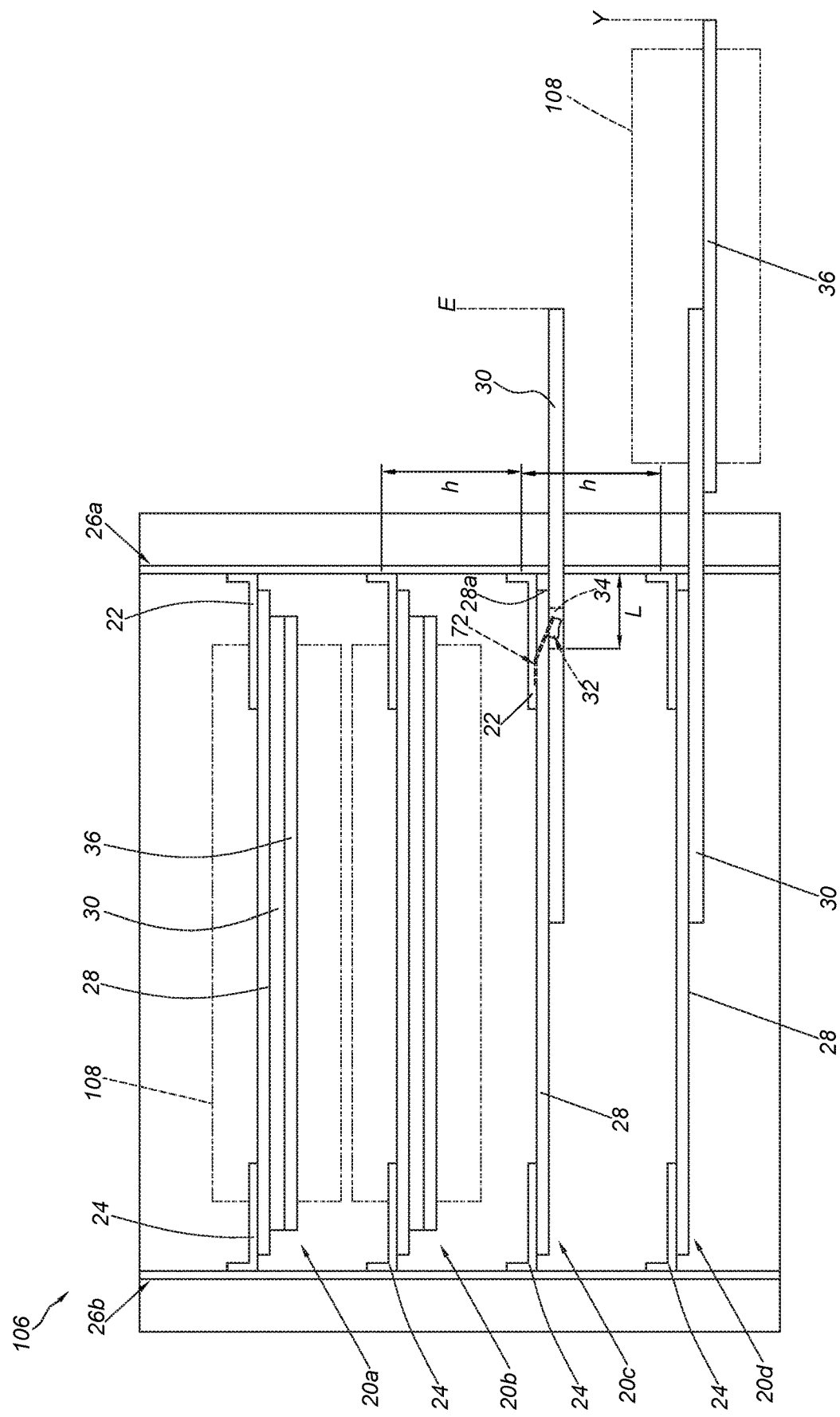
FIG. 18 is a diagram showing a plurality of slide rail assemblies being mounted to the rack according to the first embodiment of the present invention.

As shown in FIG. 18, in a rack system 106, a plurality of slide rail assemblies are usually arranged between the first post 26a and the second post 26b from top to bottom. In the present embodiment, a first slide rail assembly 20a, a second slide rail assembly 20b, a third slide rail assembly 20c and a fourth slide rail assembly 20d are arranged between the first, post 26a and the second post 26b, but the present invention is not limited thereto. Each of the slide rail assemblies comprises the first rail 28, the second rail 30 and the third rail 36. Wherein, the first rail 28 is mounted to the first post 26a and the second post 26b through the first bracket 22 and the second bracket 24 respectively. Configuration and operation of each of the slide rail assemblies are disclosed in FIG. 2 to FIG. 17. For simplification, no further illustration is provided.

Moreover, the third rail 36 of each of the slide rail assemblies is configured to carry a carried object 108 (such as an electronic apparatus). Wherein, the first slide rail assembly 20a and the second slide rail assembly 20b are in the retracted state (please also refer to FIG. 5), such that the carried objects 108 carried by the first slide rail assembly 20a and the second slide rail assembly 20b are located inside the rack. On the other hand, the second rail 30 of the third slide rail assembly 20c is located at the extended position E relative to the first rail 28, and the first structure 32 and the second structure 34 of the third slide rail assembly 20c are engaged with each other, such that a portion of the second rail 30 of the third slide rail assembly 20c is located outside the rack while the third rail 36 of the third slide rail assembly 20c is detached from the second rail 30. Furthermore, the fourth slide rail assembly 20d is in an extended state. Wherein, the third rail 36 of the fourth slide rail assembly 20d is located at the completely extended position Y relative to the second rail 30, such that the carried object 108 carried by the fourth slide rail assembly 20d is located outside the rack.

Figure 1:
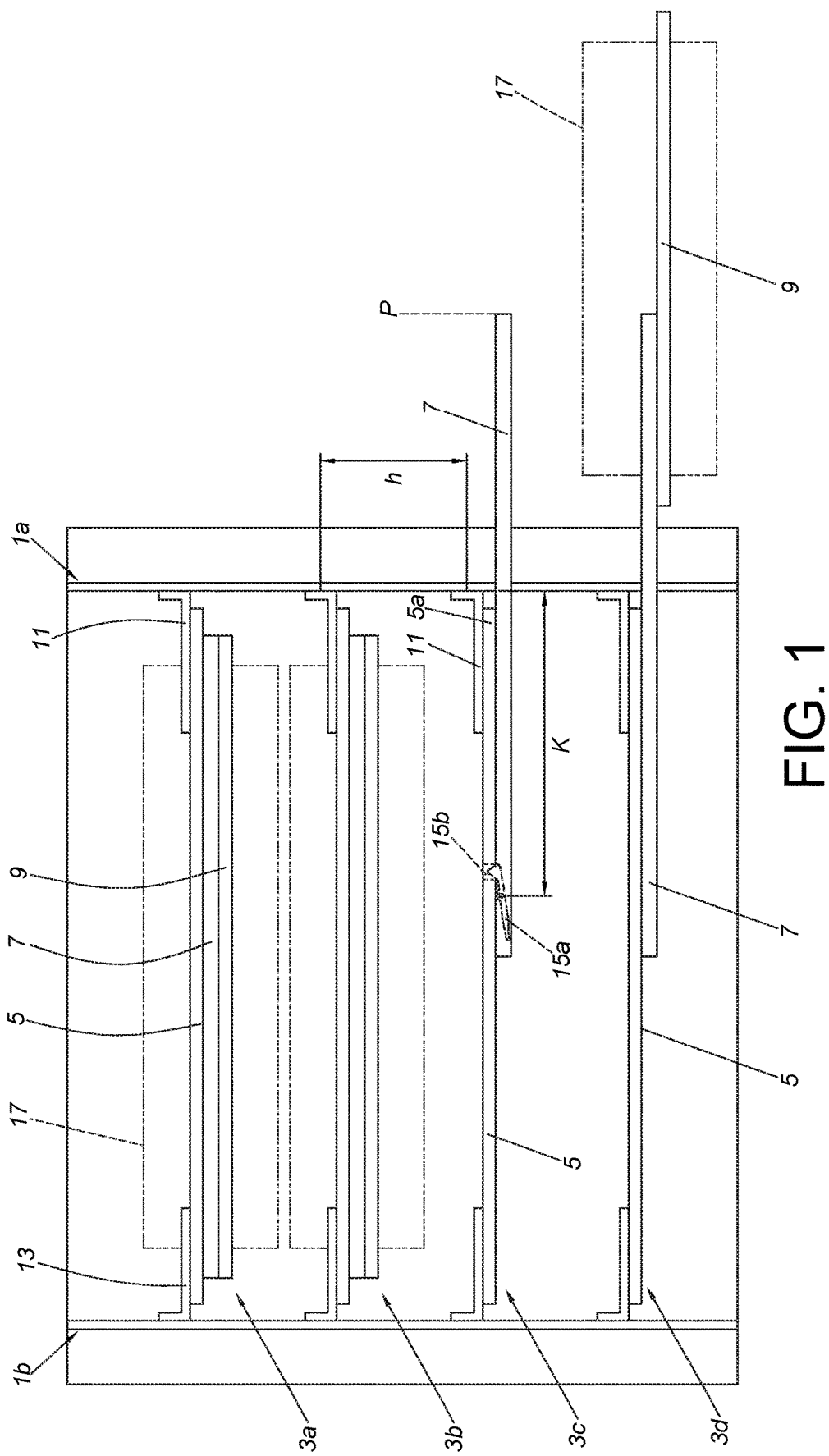
FIG. 1 is a diagram showing a plurality of slide rail assemblies of the prior art being mounted to a rack.

In addition, the rack complies with a predetermined specification. Therefore, when the slide rail assemblies are mounted to the first post 26a and the second post 26b, a specification height h is defined between the two adjacent slide rail assemblies. Under such configuration, the first structure 32 of the third slide rail assembly 20c is arranged adjacent to the first end part 28a of the first rail 28 (or adjacent to the first post 26a) and configured to be engaged with the second structure 34 to hold the second rail 30 at the extended position E. Therefore, in contrast to the prior art (as shown in FIG. 1), the user can extend the hand a shorter distance L to detach the first structure 32 from the second structure 34, such that the second rail 30 of the third slide rail assembly 20c can be retracted relative to the first rail 28 from the extended position E into the rack. It is convenient for the user to retract the second rail 30 relative to the first rail 28, in order to retract the second rail 30 into the rack. Since the second rail 30 is retracted into the rack, a person walking nearby the rack can be prevented from hitting the second rail 30 to be hurt, so as to increase safety.

Figure 19:
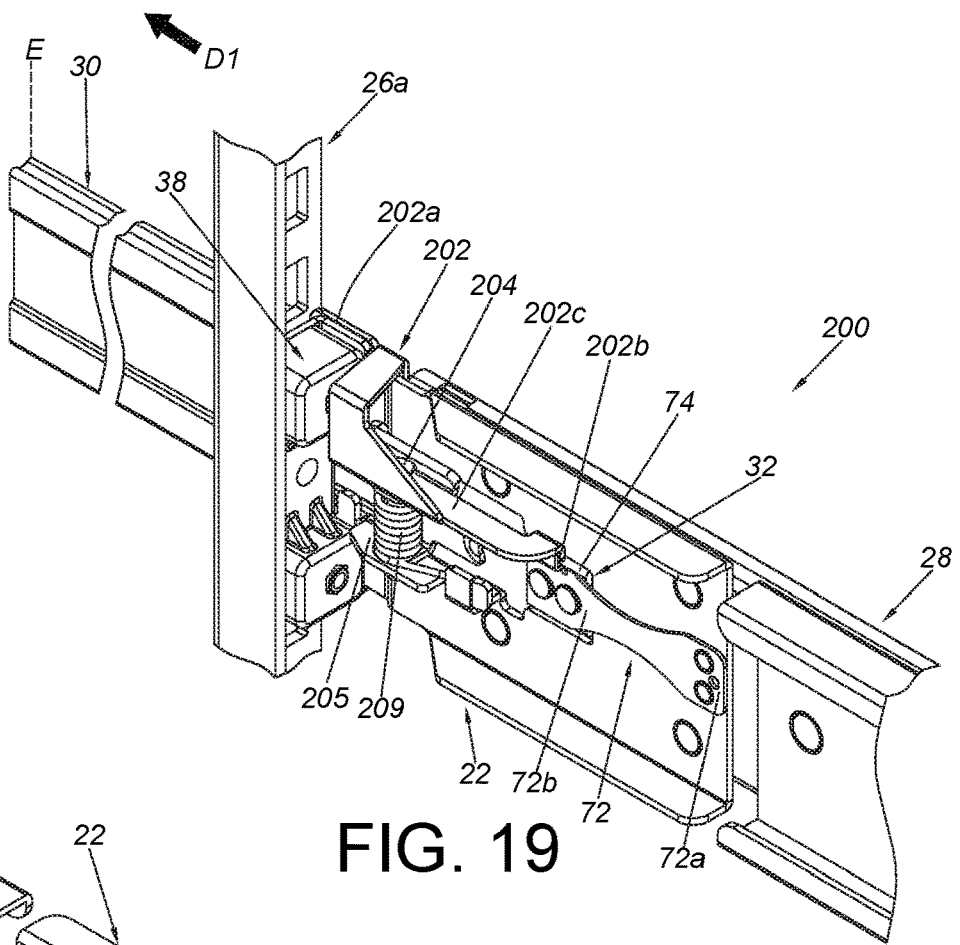
FIG. 19 is a diagram showing a slide rail assembly being mounted to a rack, with a releasing member before being operated from a viewing angle according to a second embodiment of the present invention.
Figure 20:
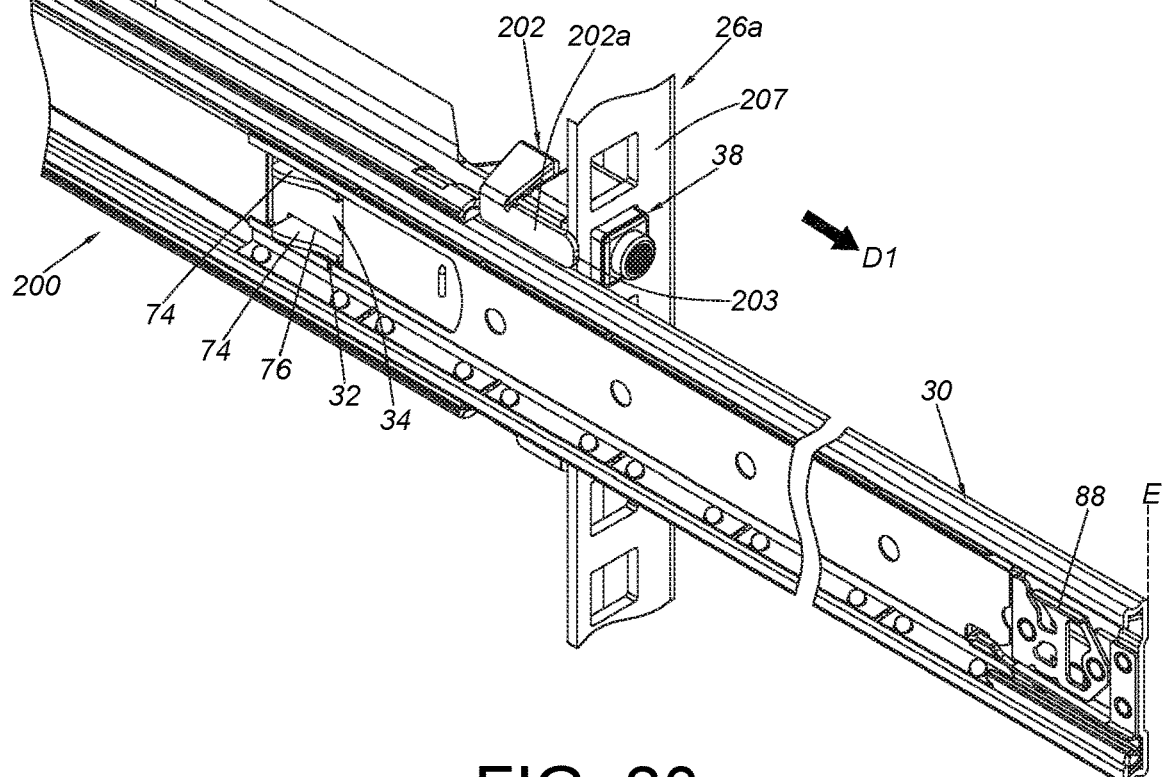
FIG. 20 is a diagram showing the slide rail assembly being mounted to the rack, with the releasing member before being operated from another viewing angle according to the second embodiment of the present invention.

FIG. 19 and FIG. 20 are diagrams showing a slide rail assembly 200 being mounted to the post of the rack from two different viewing angles according to a second embodiment of the present invention. For simplification, only the first post 26a of the rack is shown in FIG. 19 and FIG. 20. Different from the slide rail assembly 20 of the first embodiment, the slide rail assembly 200 of the second embodiment further comprises a releasing member 202.

Figure 21:
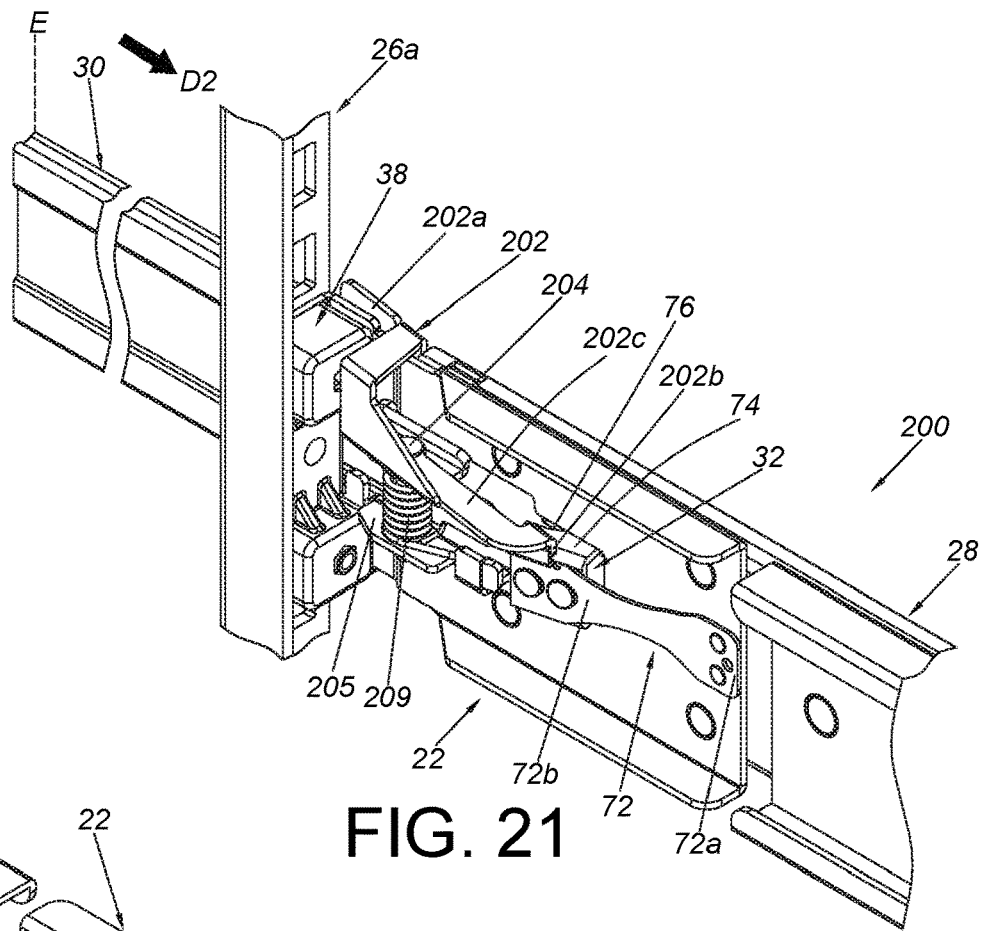
FIG. 21 is a diagram showing the slide rail assembly being mounted to the rack, with the releasing member after being operated from a viewing angle according to the second embodiment of the present invention.
Figure 22:
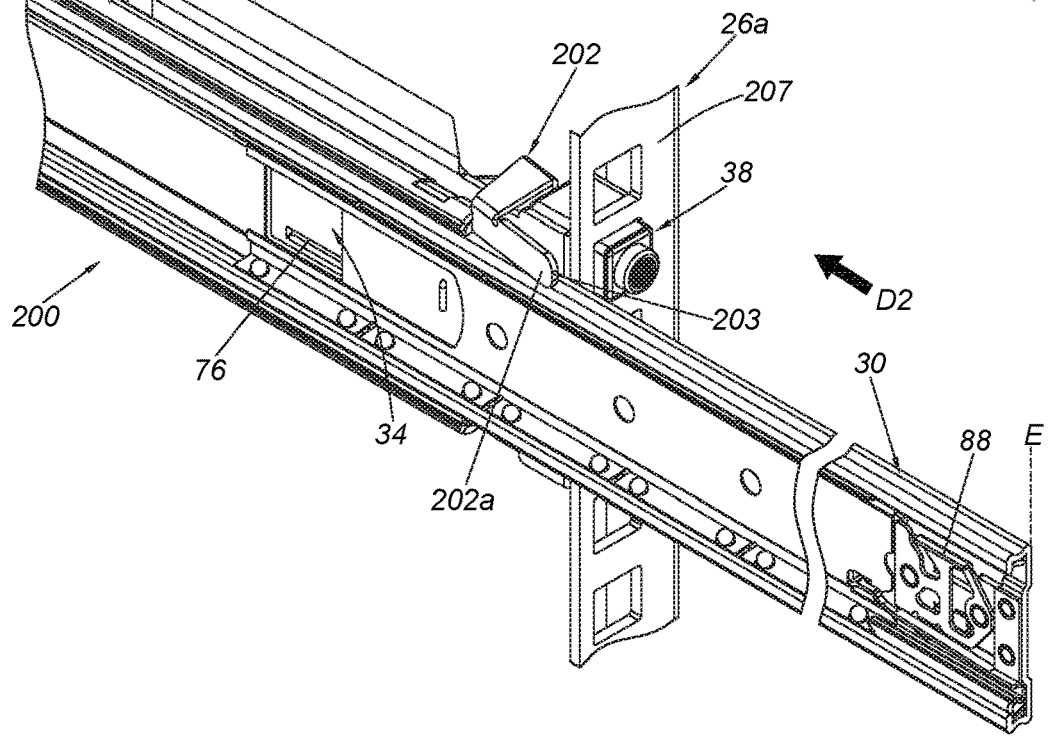
FIG. 22 is a diagram showing the slide rail assembly being mounted to the rack, with the releasing member after being operated from anther viewing angle according to the second embodiment of the present invention.

Specifically, before the releasing member 202 is operated (as shown in FIG. 19 and FIG. 20), the hook 74 of the first structure 32 is not detached from the second structure 34 (such as the hole shown in FIG. 20); and after the releasing member 202 is operated (as shown in FIG. 21 and FIG. 22), the hook 74 of the first structure 32 is detached from the second structure 34 (as shown in FIG. 22). Moreover, the releasing member 202 is movably mounted to the first bracket 22. Wherein, the releasing member 202 comprises an operating part 202a, a driving part 202b and a connecting part 202c arranged between the operating part 202a and the driving part 202b. Preferably, the connecting part 202c is pivoted to at least one lug 205 of the first bracket 22 through a pivotal shaft 204. The driving part 202b is configured to abut against a portion of the elastic component 72 (such as the end 72b). The operating part 202a is adjacent to the at least one mounting member 38 of the first bracket 22. In the present embodiment, since the at least one mounting member 38 of the first bracket 22 is mounted to the first post 26a, the operating part 202a is adjacent to the first post 26a. Preferably, the operating part 202a has one end 203 adjacent to a post surface 207 of the first post 26a, or the end 203 of the operating part 202a exceeds beyond the post surface 207 of the first post 26a along the first direction D1 (as shown in FIG. 20). As such, it is convenient for the user to apply a force to the releasing member 202 through the operating part 202a to deflect the releasing member 202 (as shown in FIG. 21 and FIG. 22), such that the other end 72b of the elastic component 72 can be operated to move to detach the hook 74 of the first structure 32 from the second structure 34. In other words, the user can disengage the first structure 32 from the second structure 34 without extending the hand into a space inside the rack, such that the second rail 30 can be retracted relative to the first rail 28 along the second direction D2 from the extended position E into the rack. Therefore, the releasing member 202 can be operated to move the elastic component 72, in order to detach the hook 74 of the first structure 32 from the second structure 34 (such as the hole). Preferably, the slide rail assembly 200 further comprises a return elastic member 209. The releasing member 202 is configured to be held at a predetermined position (as shown in FIG. 19) in response to an elastic force of the return elastic member 209.

As shown in FIG. 23 and FIG. 24, in addition to disengaging the first structure 32 from the second structure 34 through the releasing member 202 of the second embodiment, the third rail 36 can also be used to disengage the first structure 32 from the second structure 34. For example, one of the third rail 36 and the first structure 32 has a disengaging part 81. In the present embodiment, the synchronizing feature 82 of the third rail 36 has the disengaging part 81 (such as an inclined surface or an arc surface). When the third rail 36 is moved a predetermined retracted distance relative to the second rail 30 from the completely extended position Y along the second direction D2, the third rail 36 is configured to drive the first structure 32 to detach from the second structure 34 through the disengaging part 81, in order to disengage the first structure 32 from the second structure 34, such that the second rail 30 can be retracted relative to the first rail 28 from the extended position E into the rack.

Figure 25:
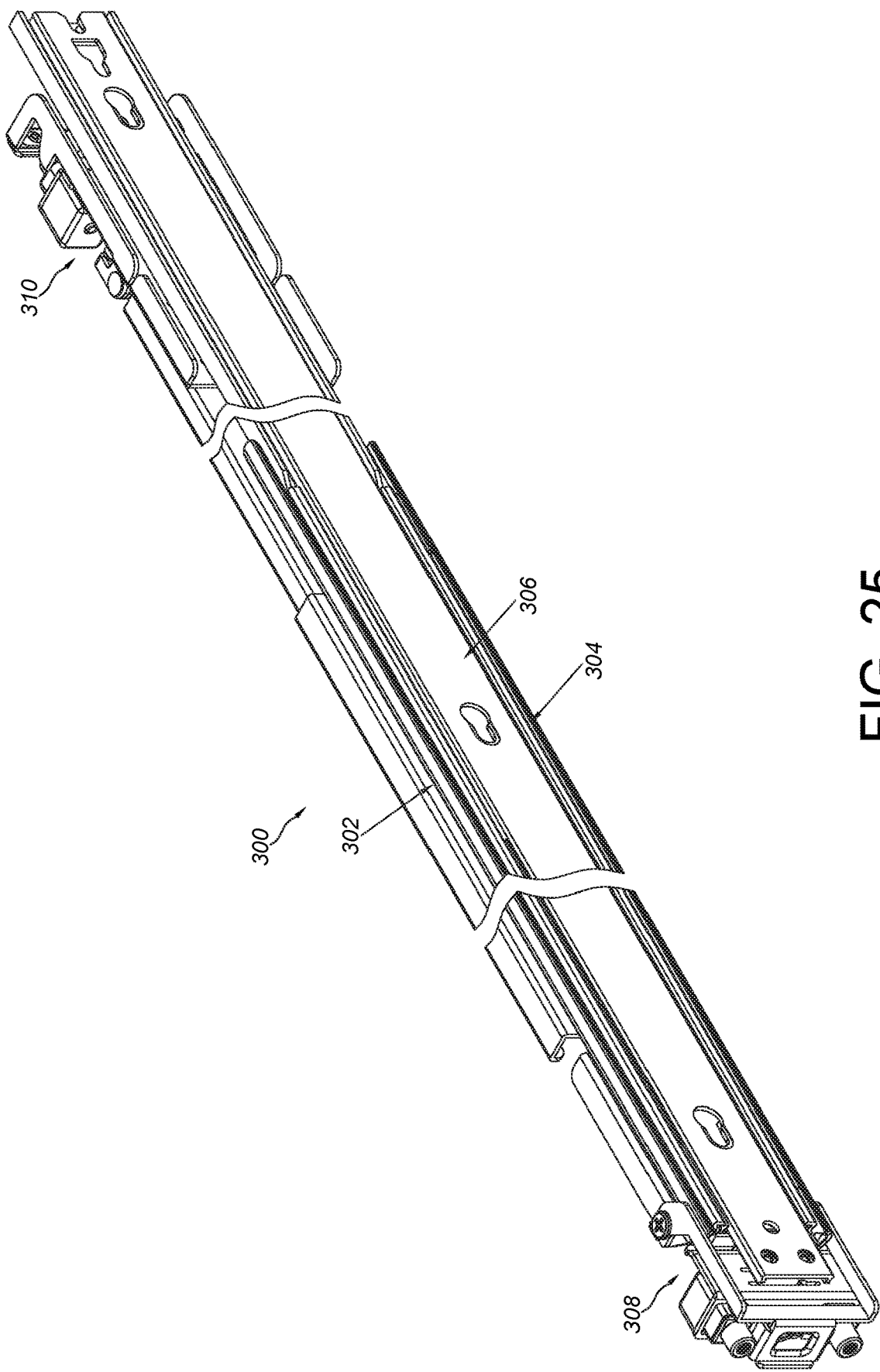
FIG. 25 is a diagram showing a slide rail assembly according to a third embodiment of the present invention.
Figure 26:
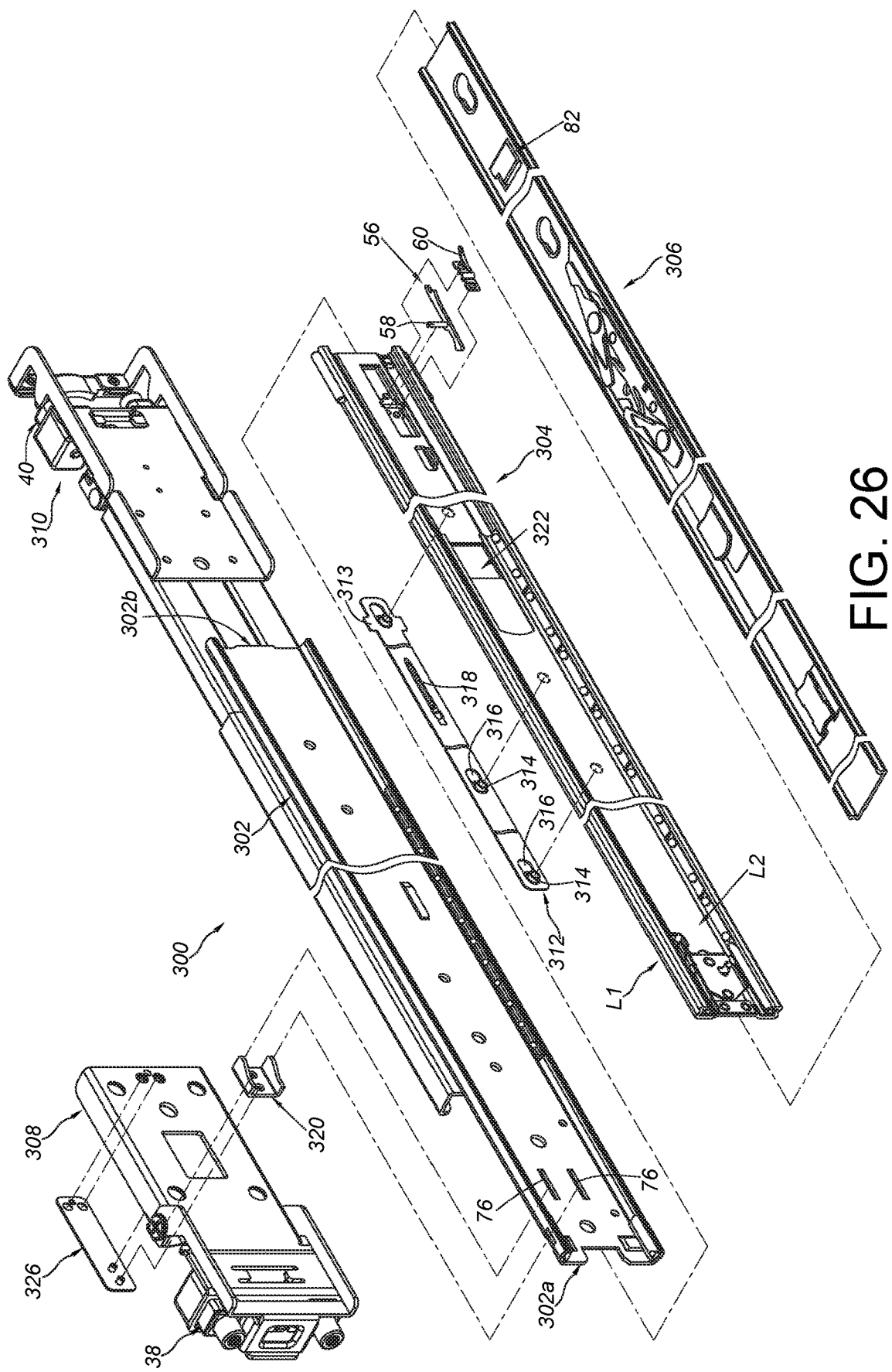
FIG. 26 is an exploded view of the slide rail assembly according to the third embodiment of the present invention.

FIG. 25 and FIG. 26 are diagrams showing a slide rail assembly 300 according to a third embodiment of the present invention. The slide rail assembly 300 comprises a first rail 302 and a second rail 304. Preferably, the slide rail assembly 300 further comprises a third rail 306, a first bracket 308 and a second bracket 310. Wherein, configurations and operations of the first rail 302, the second rail 304, the third rail 306, the first bracket 308 and the second bracket 310 are substantially identical to those of the slide rail assembly 20 of the first embodiment, thus no further illustration is provided for simplification. Different from the slide rail assembly 20 of the first embodiment, the slide rail assembly 300 of the third embodiment further comprises a disengaging member 312.

Moreover, the disengaging member 312 is arranged on the second rail 304. Preferably, a longitudinal wall of the second rail 304 has a first side L1 and a second side L2. The first side L1 is configured to face the first rail 302, and the second side L2 is configured to face the third rail 306. The disengaging member 312 is arranged at the first side L1 of the second rail 304. Preferably, the disengaging member 312 is movably mounted to the second rail 304. The disengaging member 312 and the second rail 304 are configured to be movable relative to each other within a limited range through interaction between at least one first guiding feature 314 and at least one second guiding feature 316. For example, the first guiding feature 314 and the second guiding feature 316 are respectively a protrusion and an elongated hole (such as a longitudinally elongated hole). The protrusion is configured to penetrate through a portion of the elongated hole. Preferably, the slide rail assembly 300 further comprises a return spring 318 mounted between the second rail 304 and the disengaging member 312.

Figure 27:
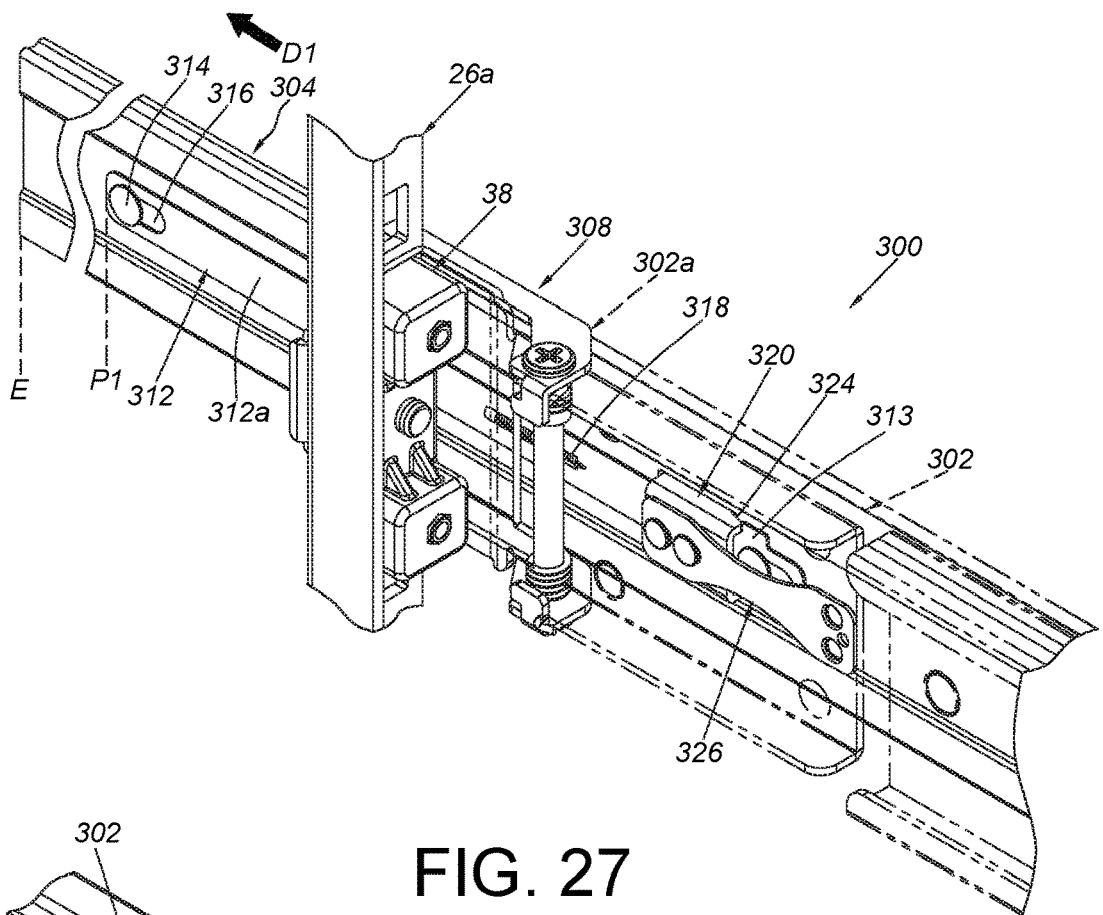
FIG. 27 is a diagram showing the slide rail assembly being mounted to the rack, with a disengaging member before being operated from a viewing angle according to the third embodiment of the present invention.
Figure 28:
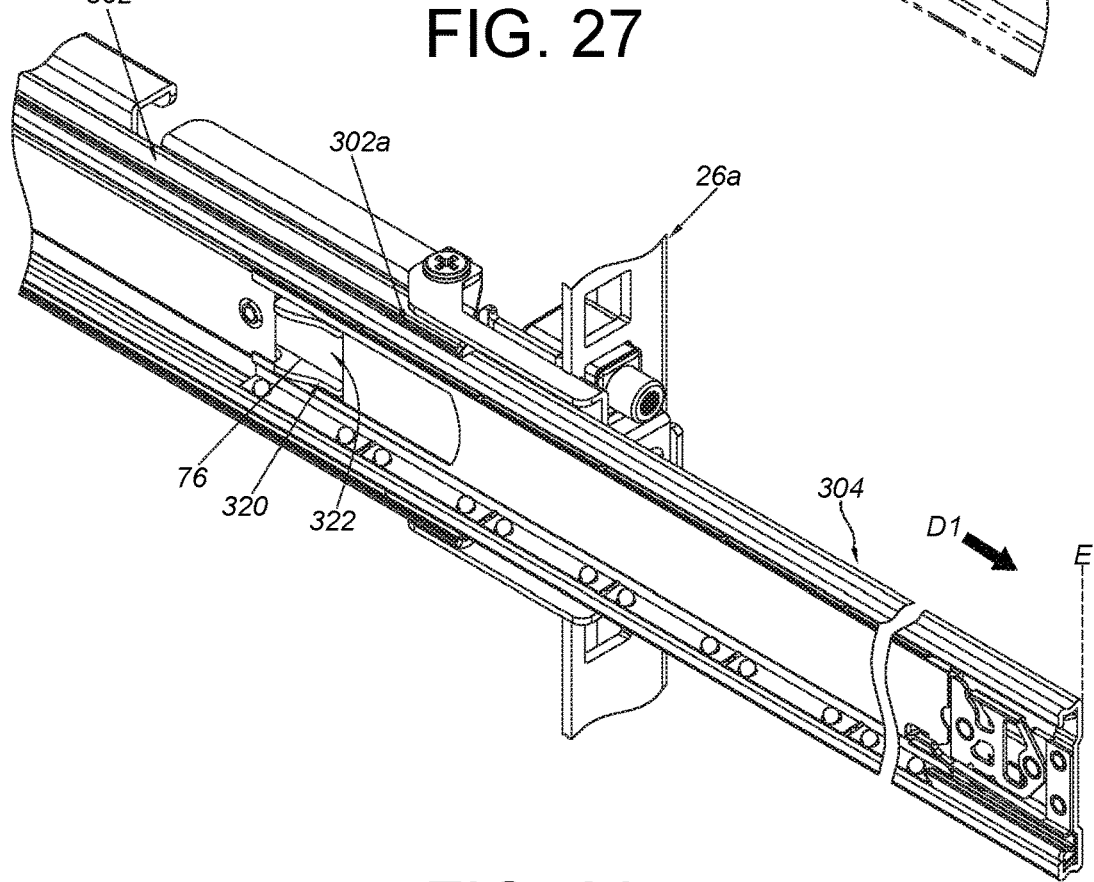
FIG. 28 is a diagram showing the slide rail assembly being mounted to the rack, with the disengaging member before being operated from another viewing angle according to the third embodiment of the present invention.

FIG. 27 and FIG. 28 are diagrams showing the slide rail assembly 300 being mounted to the post, of the rack from two different viewing angles according to the third embodiment of the present invention. For simplification, only the first post 26a of the rack is shown in FIG. 27 and FIG. 28.

Specifically, when the second rail 304 is moved relative to the first rail 302 from the retracted position R to the extended position E along the first direction D1, a first structure 320 and a second structure 322 are engaged with each other, in order to prevent the second rail 304 from being moved from the extended position E along the first direction D1 or the second direction D2. Wherein, the disengaging member 312 is configured to disengage the first structure 320 from the second structure 322. Wherein, when the second rail 304 is located at the extended position E, a portion of the disengaging member 312 (such as an operating part 312a) exceeds beyond a first end part 302a of the first rail 302, or exceeds beyond the at least one mounting member 38 of the first bracket 308. According to such arrangement, it is convenient for the user to operate the disengaging member 312 to detach the first structure 320 from the second structure 322, such that the second rail 304 can be retracted relative to the first rail 302 along the second direction D2 from the extended position E into the rack.

Figure 29:
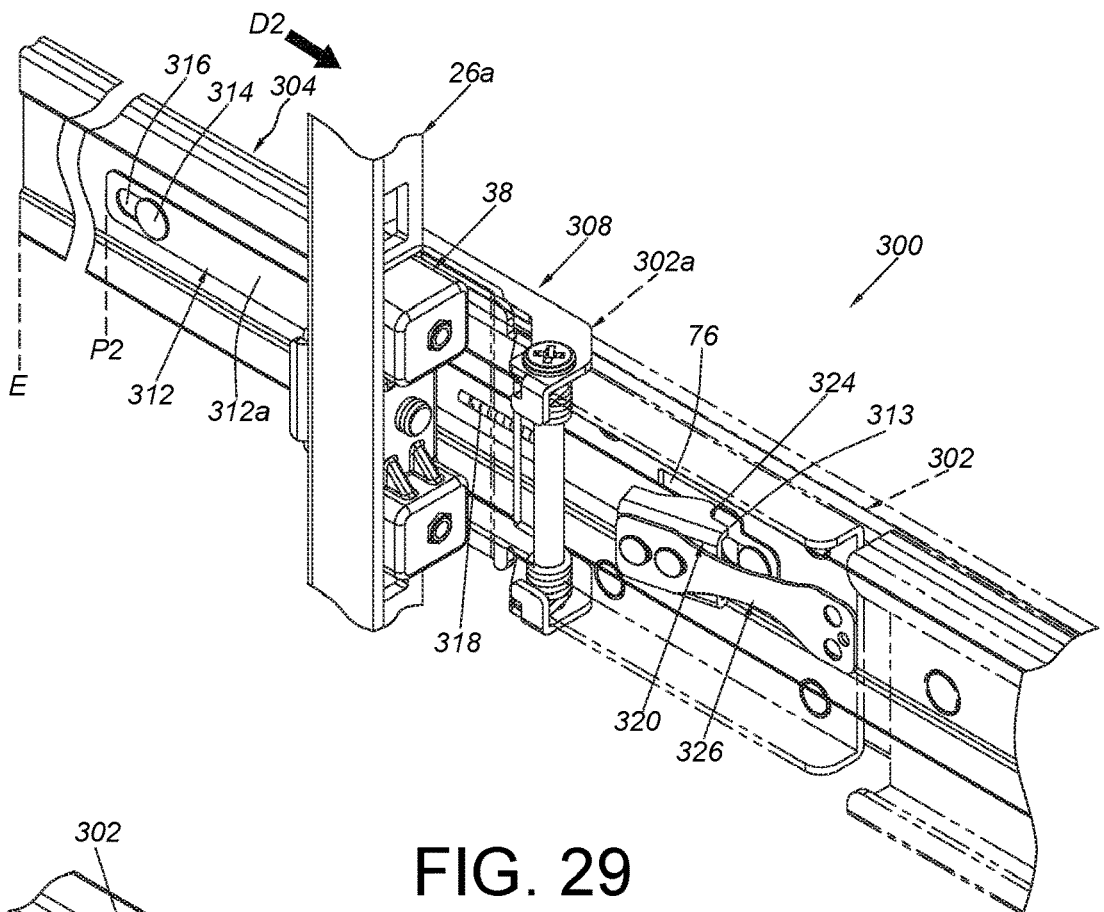
FIG. 29 is a diagram showing the slide rail assembly being mounted to the rack, with the disengaging member after being operated from a viewing angle according to the third embodiment of the present invention.
Figure 30:
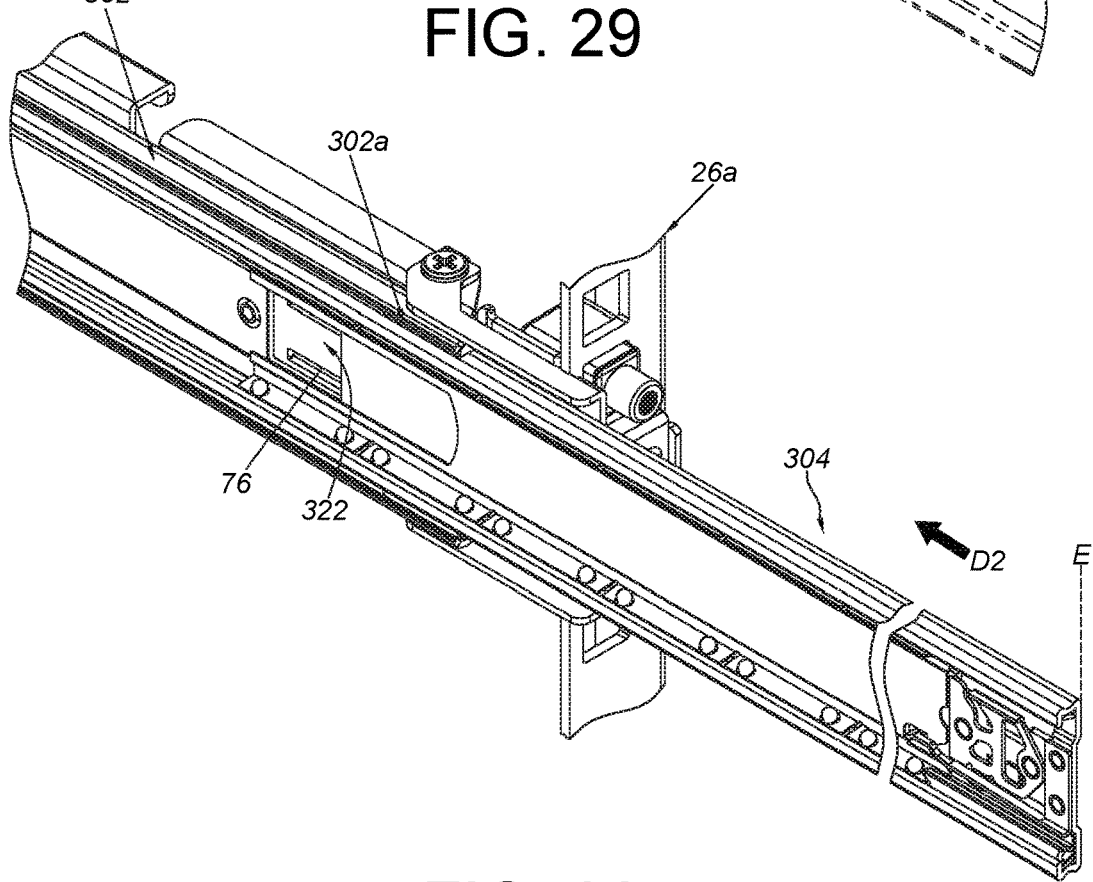
FIG. 30 is a diagram showing the slide rail assembly being mounted to the rack, with the disengaging member after being operated from another viewing angle according to the third embodiment of the present invention.

Moreover, when the user apply a force to the disengaging member 312 along the first direction D1, the disengaging member 312 is moved from a first position P1 (as shown in FIG. 27) to a second position P2 (as shown in FIG. 29) to drive the first structure 320 to disengage from the second structure 322 (as shown in FIG. 30), such that the second rail 304 can be moved and retraced relative to the first rail 302 from the extended position E along the second direction D2 (as shown in FIG. 30). Preferably, one of the disengaging member 312 and the first structure 320 has a guiding part 324 (such as an inclined surface or an arc surface). The guiding part 324 is configured to allow a pushing part 313 of the disengaging member 312 to easily deflect the first structure 320 through an elastic component 326 in order to disengage the first structure 320 from the second structure 322. Preferably, the return spring 318 is configured to provide an elastic force to the disengaging member 312, in order to hold the disengaging member 312 at a predetermined position, such as the first position P1.

In addition, in the third embodiment, a disengaging part of the third rail 306 of the slide rail assembly 300 can also be used to disengage the first structure 320 from the second structure 322. For simplification, no further illustration is provided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
a first rail arranged with a bracket;
a second rail movable relative to the first rail;
a third rail movable relative to the second rail, wherein the second rail is arranged between the first rail and the third rail;
a first structure arranged on the bracket and adjacent to an end part of the first rail; and
a second structure arranged on the second rail;
wherein when the second rail is moved relative to the first rail from a retracted position to an extended position along a first direction, the first structure and the second structure are configured to be engaged with each other, in order to prevent the second rail from being moved from the extended position along the first direction and a second direction;
wherein the second direction is opposite to the first direction;
wherein when the second rail is located at the extended position, an end part of the second rail extends beyond the end part of the first rail;
wherein the slide rail assembly further comprises a releasing member arranged on the bracket and configured to be operated to detach the first structure from the second structure.

2. The slide rail assembly of claim 1, wherein one of the third rail and the first structure is arranged with a disengaging part; when the third rail is moved a predetermined retracted distance from a completely extended position along the second direction, the third rail is configured to disengage the first structure from the second structure through the disengaging part.

3. The slide rail assembly of claim 1, wherein a first of the first structure and the second structure has a hook, and a second of the first structure and the second structure is a hole configured to allow the hook to penetrate through, such that two hole walls of the hole are located at two sides of the hook.

4. The slide rail assembly of claim 1, wherein the releasing member has an operating part, and the operating part is adjacent to at least one mounting member of the bracket.

5. The slide rail assembly of claim 1, wherein the first rail is arranged with a disengaging feature, a synchronizing member is movably mounted to the second rail, and the third rail comprises a synchronizing feature; the synchronizing feature is configured to abut against the synchronizing member in a predetermined state, in order to allow the second rail and the third rail to synchronously move relative to the first rail along the first direction; when the second rail and the third rail are moved to the extended position, the disengaging feature is configured to move the synchronous member to be no longer in the predetermined state, such that the second rail is no longer synchronously moved with the third rail.

6. The slide rail assembly of claim 5, wherein the synchronous member is pivoted to the second rail, and the slide rail assembly further comprises an elastic feature configured to provide an elastic force to the synchronous member, in order to hold the synchronous member in the predetermined state.

7. A slide rail assembly, comprising:
a first rail having a front part and a rear part;
a second rail movable relative to the first rail along a first direction and a second direction, wherein the second direction is opposite to the first direction, a blocking part is arranged on the second rail and adjacent to an end part of the second rail;

a third rail movable relative to the second rail along the first direction and the second direction, wherein the second rail is arranged between the first rail and the third rail;

a first bracket arranged adjacent to the front part of the first rail, the first bracket comprising at least one mounting member configured to mount the first rail to a first post of a rack;

a second bracket movably arranged adjacent to the rear part of the first rail, the second bracket comprising at least one mounting member configured to mount the first rail to a second post of the rack;

a first structure arranged on the first bracket; and a second structure arranged on the second rail;

wherein when the second rail is moved along the first direction to be located at an extended position relative to the first rail, the first structure and the second structure are configured to be engaged with each other, in order to prevent the second rail from being moved from the extended position along the first direction and the second direction;

wherein when the second rail is located at the extended position, the end part of the second rail extends beyond the front part of the first rail;

wherein when the third rail is located at a completely extended position relative to the second rail, the blocking part is configured to prevent the third rail from being moved from the completely extended position along the first direction and the second direction.

8. The slide rail assembly of claim 7, further comprising a disengaging member movably arranged on the second rail, wherein when the second rail is located at the extended position, an operating part of the disengaging member exceeds beyond the at least one mounting member of the first bracket, and the disengaging member is configured to disengage the first structure from the second structure.

9. The slide rail assembly of claim 8, wherein one of the disengaging member and the first structure has a guiding part, and the disengaging member is configured to disengage the first structure from the second structure through the guiding part.

10. The slide rail assembly of claim 7, wherein a first of the first structure and the second structure has a hook, and a second of the first structure and the second structure is a hole configured to allow the hook to penetrate through, such that two hole walls of the hole are located at two sides of the hook.

11. The slide rail assembly of claim 10, wherein the first bracket is arranged with an elastic component, and the hook is arranged on the elastic component.

12. The slide rail assembly of claim 11, further comprising a releasing member arranged on the first bracket, wherein the releasing member has an operating part configured to be operated to detach the hook from the hole, and the operating part is adjacent to the at least one mounting member of the first bracket.

13. The slide rail assembly of claim 7, wherein one of the third rail and the first structure is arranged with a disengaging part, wherein when the third rail is moved a predetermined retracted distance from a completely extended position along the second direction, the third rail is configured to disengage the first structure from the second structure through the disengaging part.

14. A slide rail assembly, comprising:

a first rail having a front part and a rear part;

a second rail movable relative to the first rail along a first direction and a second direction, wherein the second direction is opposite to the first direction;

a third rail movable relative to the second rail along the first direction and the second direction, wherein the second rail is arranged between the first rail and the third rail;

a first bracket arranged adjacent to the front part of the first rail, the first bracket comprising at least one mounting member configured to mount the first rail to a first post of a rack;

a second bracket movably arranged adjacent to the rear part of the first rail, the second bracket comprising at least one mounting member configured to mount the first rail to a second post of the rack;

a first structure arranged on the first bracket; and a second structure arranged on the second rail;

wherein when the second rail is moved along the first direction to be located at an extended position relative to the first rail, the first structure and the second structure are configured to be engaged with each other, in order to prevent the second rail from being moved from the extended position along the first direction and the second direction;

wherein when the second rail is located at the extended position, an end part of the second rail extends beyond the front part of the first rail;

wherein the first rail is arranged with a disengaging feature, a synchronizing member is movably mounted to the second rail and spaced apart from the second structure, and the third rail comprises a synchronizing feature; wherein the synchronizing feature is configured to abut against the synchronizing member in a predetermined state, in order to allow the second rail and the third rail to synchronously move relative to the first rail along the first direction from a retracted position; wherein when the second rail is moved to the extended position, the disengaging feature is configured to move the synchronous member to be no longer in the predetermined state, such that the second rail is no longer synchronously moved with the third rail along the first direction;

wherein when the third rail is moved a predetermined retracted distance from a completely extended position along the second direction, the third rail is configured to disengage the first structure from the second structure through the synchronizing feature.

* * * * *